US012751229B2

(12) United States Patent
Blanquart et al.

(10) Patent No.: US 12,751,229 B2
(45) Date of Patent: Sep. 29, 2026

(54) METHODS AND SYSTEMS FOR TOPOGRAPHY-SELECTIVE DEPOSITIONS

(71) Applicant: ASM IP Holding, B.V., Almere (NL)

(72) Inventors: Timothee Blanquart, Oud-Heverlee (BE); René Henricus Jozef Vervuurt, Leuven (BE); Shaoren Deng, Ghent (BE)

(73) Assignee: ASM IP Holding B.V., Almere (NL)

( * ) Notice: Subject to any disclaimer, the term of this patent is extended or adjusted under 35 U.S.C. 154(b) by 516 days.

(21) Appl. No.: 18/348,602

(22) Filed: Jul. 7, 2023

(65) Prior Publication Data

US 2025/0014908 A1 Jan. 9, 2025

Related U.S. Application Data

(60) Provisional application No. 63/369,854, filed on Jul. 29, 2022, provisional application No. 63/345,315, filed on May 24, 2022.

(51) Int. Cl.

| | |
|---|---|
| ***H10P 50/00*** | (2026.01) |
| ***H10P 14/60*** | (2026.01) |
| ***H10P 50/28*** | (2026.01) |
| ***H10P 76/20*** | (2026.01) |
| ***H10W 20/00*** | (2026.01) |

(52) U.S. Cl.

CPC .......... *H10P 50/73* (2026.01); *H10P 14/6304* (2026.01); *H10P 14/6319* (2026.01); *H10P 14/6336* (2026.01); *H10P 14/6339* (2026.01); *H10P 50/285* (2026.01); *H10P 76/20* (2026.01); *H10W 20/096* (2026.01); *H10W 20/098* (2026.01)

(58) Field of Classification Search

None

See application file for complete search history.

(56) References Cited

U.S. PATENT DOCUMENTS

| | | | | |
|---|---|---|---|---|
| 3,982,943 | A * | 9/1976 | Feng | H05K 3/048 430/314 |
| 6,069,069 | A * | 5/2000 | Chooi | H01L 21/02126 438/642 |
| 7,825,040 | B1 | 11/2010 | Fukazawa et al. | |
| 7,977,249 | B1 * | 7/2011 | Liu | H10P 50/283 438/724 |

(Continued)

FOREIGN PATENT DOCUMENTS

| | | | |
|---|---|---|---|
| CN | 112687626 | B | 1/2023 |
| KR | 20220053668 | A | 4/2022 |
| WO | 2019035945 | A1 | 2/2019 |

OTHER PUBLICATIONS

Putkonen, Matti, et al. "Atomic layer deposition of polyimide thin films." Journal of Materials Chemistry 17.7 (2007): 664-669.

*Primary Examiner* — Erik Kielin

(74) *Attorney, Agent, or Firm* — Banner & Witcoff, Ltd.

(57) ABSTRACT

Disclosed are methods and related systems for topography-selective depositions. Embodiments of presently described methods comprise employing a sacrificial gap filling fluid for selectively forming a material on a distal surface of a gap, and not on at least one of sidewalls of the gap and proximal surfaces. Further described are methods for filling a gap with a high quality material by means of a sacrificial gap filling fluid.

20 Claims, 15 Drawing Sheets

(56) References Cited

U.S. PATENT DOCUMENTS

| | | | | |
|---|---|---|---|---|
| 10,192,867 | B1 | 1/2019 | Frougier et al. | |
| 10,695,794 | B2 | 6/2020 | Pore et al. | |
| 10,923,356 | B2 | 2/2021 | Kal et al. | |
| 11,164,793 | B2 | 11/2021 | Xie et al. | |
| 2010/0178481 | A1 | 7/2010 | George et al. | |
| 2014/0070357 | A1* | 3/2014 | Cheng | H10D 86/201<br>257/E21.546 |
| 2014/0363983 | A1 | 12/2014 | Nakano et al. | |
| 2015/0056821 | A1 | 2/2015 | Ishikawa et al. | |
| 2016/0163561 | A1 | 6/2016 | Hudson et al. | |
| 2016/0181414 | A1* | 6/2016 | Huang | H10D 30/024<br>438/283 |
| 2019/0109004 | A1* | 4/2019 | Huang | H01L 21/0245 |
| 2019/0378906 | A1 | 12/2019 | Loubet et al. | |
| 2020/0013613 | A1* | 1/2020 | Blanquart | C23C 16/5096 |
| 2021/0020432 | A1 | 1/2021 | Blanquart | |
| 2021/0202326 | A1 | 7/2021 | Schwarzenbach et al. | |
| 2021/0249303 | A1 | 8/2021 | Blanquart | |
| 2021/0358745 | A1 | 11/2021 | Maes et al. | |
| 2022/0119944 | A1 | 4/2022 | Yoshimoto et al. | |
| 2022/0165731 | A1 | 5/2022 | Huang et al. | |
| 2022/0199472 | A1 | 6/2022 | Chao et al. | |
| 2022/0238680 | A1 | 7/2022 | Hung et al. | |
| 2022/0254640 | A1 | 8/2022 | Yang et al. | |
| 2022/0262629 | A1 | 8/2022 | Gandikota et al. | |
| 2022/0328317 | A1 | 10/2022 | Na et al. | |
| 2023/0062026 | A1* | 3/2023 | Yu | H10D 64/017 |
| 2023/0178371 | A1 | 6/2023 | Deng et al. | |
| 2023/0290863 | A1* | 9/2023 | Lyu | H10D 30/024 |
| 2023/0386833 | A1* | 11/2023 | Wu | C23C 14/5873 |

* cited by examiner

METHODS AND SYSTEMS FOR TOPOGRAPHY-SELECTIVE DEPOSITIONS

CROSS-REFERENCE TO RELATED APPLICATIONS

This application claims the benefit of U.S. Provisional Application 63/369,854 filed on Jul. 29, 2022 and U.S. Provisional Application 63/345,315 filed on May 24, 2022, the entire contents of which are incorporated herein by reference.

FIELD OF INVENTION

The present disclosure generally relates to the field of semiconductor processing methods and systems, and to the field integrated circuit manufacture. In particular, methods and systems suitable for topography-selective depositions and methods of filling a gap are disclosed.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

For example, one challenge relates to methods and systems for obtaining depositions that result in formation of a material layer in one part of a topography, and not in another. For example, it is desirable to form layers such as silicon oxide or silicon nitride on a distal part of a structure, and not on a proximal of a structure.

Another challenge relates to methods and systems for filling high aspect ratio structures with a material having no voids, seams, or pinholes. Flowable gapfill approaches can fill such high aspect ratio structures voidlessly and seamlessly, but those approaches can require a thermal or other treatment in order to obtain a high-quality material in the high aspect ratio structures. Conformal deposition approaches can fill high aspect ratio structures partially, but a weak spot, a so-called seam, is formed which can result in defect formation during further processing steps such as chemical mechanical polishing. Thus, there remains a need for methods and systems that allow filling high aspect ratio structures with a material that has no voids, seams, or pinholes.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Described herein is a method of forming a material layer on a distal surface in a gap. The method comprises providing a substrate. The substrate comprises a proximal surface and a gap. The gap comprises a distal surface and sidewalls. The method further comprises forming a material layer overlying the proximal surface, the distal surface, and the sidewalls. The method further comprises partially filling the gap with a gap filling fluid.

Thus, a protected distal material layer and an unprotected proximal material layer are formed. The protected distal material layer overlies the distal surface. The protected distal surface is covered by gap filling fluid. The unprotected material layer overlies the sidewalls and the proximal surface. The method further comprises selectively etching the unprotected proximal material layer vis-à-vis the gap filling fluid.

The method further comprises removing the gap filling fluid from the substrate. Thus, a distal layer is formed on the distal surface.

In some embodiments, the following steps are carried out in a single vacuum system without any intervening vacuum breaks: forming the material layer, partially filling the gap with a gap filling fluid, selectively etching the unprotected proximal material layer, and removing the gap filling fluid.

In a method of forming a material layer on a distal surface in a gap, forming the material layer on the distal surface of the gap can be repeated a plurality of times. This suitably results in bottom-up filling of the gap with the material layer. Thus, further described herein is a related method of filling a gap. The method comprises providing a substrate. The substrate comprises a proximal surface and a gap. The gap comprises a distal surface and sidewalls.

The method further comprises executing a plurality of super cycles, which result in filling the gap with a solid fill material. A super cycle comprises forming a material layer overlying the proximal surface, the distal surface, and the sidewalls. The material layer comprises a solid fill material. The super cycle further comprises filling the gap with a gap filling fluid. Thus, the material layer is partially covered with a gap filling fluid to form a protected distal material layer and an unprotected proximal material layer. The protected distal material layer overlies the distal surface. The protected distal surface is covered by gap filling fluid, and the unprotected material layer overlies the sidewalls and the proximal surface. The super cycle further comprises selectively etching the unprotected proximal material layer vis-à-vis the gap filling fluid. The super cycle further comprises removing the gap filling fluid from the substrate.

In some embodiments, the plurality of super cycles are sequentially carried out in a single vacuum system, without any intervening vacuum breaks.

In some embodiments, the material layer comprises a solid material. The solid material comprises one or more elements selected from a transition metal, a rare earth metal, a post transition metal, and a group 14 element.

In some embodiments, the solid material comprises one or more of titanium oxide and titanium nitride.

In some embodiments, the solid material comprises one or more of a group 14 element oxide and a group 14 element nitride.

In some embodiments, the solid material comprises one or more of silicon oxide, silicon nitride, and silicon carbonitride.

In some embodiments, selectively etching the unprotected proximal material layer comprises a. converting the unprotected proximal material layer into a converted material layer; and, b. selectively etching the converted material layer vis-à-vis the gap filling fluid.

In some embodiments, the solid material comprises silicon nitride, the converting step comprises generating an oxygen plasma, the converted material layer comprises silicon oxide, and the selective etching step comprises exposing the substrate to a fluorine species.

In some embodiments, the fluorine species comprises fluorine radicals.

In some embodiments, forming the material layer comprises executing a cyclical deposition process. The cyclical deposition process comprises a plurality of deposition cycles. A deposition cycle comprises a material layer precursor pulse and a material layer reactant pulse. The material layer precursor pulse comprises contacting the substrate with a material layer precursor. The material layer reactant pulse comprises contacting the substrate with a material layer reactant.

In some embodiments, partially filling the gap with a gap filling fluid comprises generating a plasma.

In some embodiments, partially filling the gap with a gap filling fluid comprises positioning the substrate on a substrate support comprised in a gap filling fluid reaction space. The gap filling fluid reaction space further comprises a showerhead injector. The plasma is generated between the substrate and the showerhead injector. Partially filling the gap with a gap filling fluid further comprises providing a gap filling fluid precursor to the reaction space.

In some embodiments, the gap filling fluid precursor comprises a hydrocarbon.

In some embodiments, the hydrocarbon is an aromatic hydrocarbon.

In some embodiments, the aromatic hydrocarbon is toluene.

In some embodiments, removing the gap filling fluid from the substrate comprises generating an oxygen plasma.

In some embodiments, removing the gap filling fluid from the substrate comprises exposing the substrate to a solvent.

In some embodiments, partially filling the gap with the gap filling fluid comprises forming a reflowable material in the gap; and, annealing the substrate to a temperature in excess of a pre-determined temperature, thereby at least partially melting the reflowable material to form the gap filling fluid that at least partially fills the gap.

Further described herein is a semiconductor processing facility that comprises a material layer deposition reactor, a gap filling fluid formation reactor, a material layer etching reactor, a gap filling fluid removal reactor, a substrate moving robot, and a controller. The controller is arranged to receive computer-readable instructions which, when carried out, cause the semiconductor processing facility to carry out a method as described herein.

Further described herein is a substrate processing system that comprises a gap fill reaction chamber, a gap fill etching chamber, a material layer deposition chamber, a material layer etching chamber, and a wafer transfer robot. The wafer transfer robot is arranged for moving a wafer between the gap fill reaction chamber, the gap fill etching chamber, the material layer deposition chamber, and the material layer etching chamber, without any intervening vacuum break. The gap fill reaction chamber is arranged for forming a gap filling fluid on the wafer. The gap fill etching chamber is arranged for removing the gap filling fluid from the wafer. The material layer deposition chamber is arranged for forming a material layer on the wafer. The material layer etching chamber is arranged for partially removing the material layer from the wafer. The substrate processing system further comprises a controller that is arranged for causing the substrate processing system to carry out a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

FIGS. 1A-1F schematically show incremental results of process steps in an embodiment of a method as disclosed herein.

FIGS. 2A-2F schematically show incremental results of process steps in an embodiment of a method as disclosed herein.

FIG. 3 schematically shows a flow chart of an embodiment of a method as described herein.

Figure 1A:
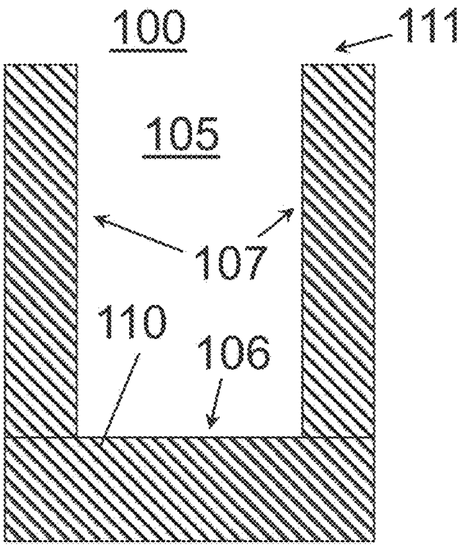

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as gaps, protrusions, and the like formed within or on at least a portion of a layer of the substrate. By way of examples, a substrate can include bulk semiconductor material and an insulating or dielectric material layer overlying at least a portion of the bulk semiconductor material. Additionally or alternatively, an exemplary substrate can comprise bulk semiconductor material and a conductive layer overlying at least a portion of the bulk semiconductor material. Suitable substrate supports include pedestals, susceptors, and the like.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to form a layer over a substrate. "Cyclical deposition processes" are examples of "deposition processes".

The term "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using an inert gas such as a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein. The terms "precursor" and "reactant" can be used interchangeably.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to “typically or broadly comprising,” “comprising,” “consisting essentially of,” or “consisting of” in some embodiments.

In this disclosure, any defined meanings do not necessarily exclude ordinary and customary meanings, in some embodiments.

Described herein is a method that can be employed for forming a distal layer on a distal surface of a gap feature comprised in a substrate. In other words, disclosed are methods and related systems for topography-selective depositions. Embodiments of presently described methods comprise employing a sacrificial gap filling fluid for selectively forming a material on a distal surface of a gap, and not, or not substantially, on at least one of sidewalls of the gap and proximal surfaces.

The method comprises providing a substrate. The substrate comprises a proximal surface and a gap. The gap comprises a distal surface and sidewalls. The method further comprises forming a material layer. The material layer overlies the proximal surface, the distal surface, and the sidewalls. In some embodiments, the material layer is conformal, i.e. it has the same thickness regardless of where it is formed on the substrate. In some embodiments, the material layer is distal-heavy, i.e. it has a greater thickness near or at the distal end of the gap compared to the sidewalls of the gap and the substrate’s proximal surfaces. In some embodiments, the material layer is proximal-heavy, i.e. it has a greater thickness near or on the substrate’s proximal surfaces compared to the sidewalls of the gap and the distal end of the gap.

The method further comprises partially filling the gap with a gap filling fluid. In some embodiments, partially filling the gap with a gap filling fluid can comprise completely filling the gap with a gap filling fluid, and then partially recessing the gap filling fluid. Recessing can be done with any suitable etching step, including the application of a plasma such as an oxygen plasma or a hydrogen plasma.

Alternatively, partially filling the gap can comprise forming a limited amount of gap filling fluid in the gap. In such embodiments, a wetting layer can be formed on sidewalls of the gap and on proximal surfaces outside the gap. Such a wetting layer can be suitably removed by means of a suitable treatment such as a plasma treatment. Suitable plasma treatments for removing wetting layers can include exposing the substrate to an oxygen plasma or to an hydrogen plasma.

Exemplary gap filling fluids include various oligomers, including organic oligomers and inorganic oligomers. Organic oligomers can be suitably recessed using suitable plasmas such as hydrogen plasmas and oxygen plasmas. Organic oligomers include olefin oligomers, such as toluene oligomers, and polyketone oligomers. Inorganic oligomers include polyp oligomers, polysiloxane oligomers, polysilane oligomers, metal halide oligomers, and polycarbosiloxane oligomers. Inorganic oligomers can be removed using suitable etchants such as fluorine radicals, which can be generated in a plasma such as a remote plasma. Thus, a protected distal material layer and an unprotected proximal material layer are formed. The protected distal material layer overlies the distal surface. The protected distal surface is covered by gap filling fluid. The unprotected material layer overlies the sidewalls and the proximal surface. The method further comprises selectively etching the unprotected proximal material layer vis-à-vis the gap filling fluid. Then, the method comprises removing the gap filling fluid from the substrate. Thus, a distal layer is formed on the distal surface.

The distal layer can have a very high quality when compared to, for example, oligomeric substances such as certain gap filling fluids.

It shall be understood that when a gap is partially filled with a gap filling fluid, it can be filled for, for example from at least 1 volume percent to at most 20 volume percent, or from at least 5 volume percent to at most 10 volume percent, or from at least 20 volume percent to at most 50 volume percent, or from at least 50 volume percent to at most 80 volume percent. In some embodiments, the gap is completely filled with gap filling fluid. In such embodiments, a certain overburden can be formed on the substrate as well, i.e. more gap filling fluid can be formed on the substrate than is strictly needed to completely fill the gaps. Advantageously, such overfilling can reduce the aspect-ratio dependency of the gap filling step. In other words, overfilling can improve the evenness at which gaps are filled, even if they have different aspect ratios.

In some embodiments, the following steps are carried out in a single vacuum system without any intervening vacuum breaks: forming the material layer, partially filling the gap with a gap filling fluid, selectively etching the unprotected proximal material layer, and removing the gap filling fluid.

Further described herein is a method for filling a gap. The method comprises a step of providing a substrate. The substrate comprises a proximal surface and a gap, the gap comprising a distal surface and sidewalls.

The method further comprises executing a plurality of super cycles. A super cycle comprises forming a material layer, partially filling the gap with a gap filling fluid, selectively etching the unprotected proximal material layer, and removing the gap filling fluid. Thus, by executing a suitable amount of super cycles, the gap can be filled.

It shall be understood that the material layer, when formed, overlies the proximal surface, the distal surface, and the sidewalls. It shall be further understood that the material layer comprises a solid fill material, and the gap can be filled with that solid fill material.

When the gap is partially filled with a gap filling fluid, gap filling fluid ends up in a distal portion of the gap. Without wishing to be bound to any particular theory or mode of operation, it shall be understood that it is believed that the gap filling fluid is pulled towards the distal portion of the gap by surface tension. It shall be understood that a distal portion of a gap refers to the portion of the gap that is farthest removed from the substrate’s surface. Thus, the gap filling fluid covers the material layer at the distal portion of the gap, and not, or not substantially, on the sidewalls or at a proximal surface. This notwithstanding, it might be possible that a minor amount of gap filling fluid, a so-called wetting layer, is formed on the sidewalls and on the proximal surface. Thus, a protected distal material layer and an unprotected proximal material layer are formed. The protected distal material layer overlies the distal surface and the protected distal surface being covered by a gap filling fluid. The unprotected material layer overlies the sidewalls and the proximal surface.

After the gap filling fluid has been formed, the unprotected proximal material layer can be selectively etched vis-à-vis the gap filling fluid. It shall be understood that in embodiments in which a wetting layer is present overlying the sidewalls and the proximal surfaces after the gap filling fluid has been formed, that wetting layer can be advantageously removed before selectively etching the unprotected proximal material layer vis-à-vis the gap filling fluid. The wetting layer can be removed, for example when the gap filling fluid comprises hydrocarbon oligomers, by means of an oxygen plasma. In some embodiments, no wetting layer is present after gap filling fluid formation, for example when the gap filling fluid is formed by first completely filling the gap and subsequent recessing of the gap filling fluid. In such embodiments, no wetting layer removal step is necessary.

Since the gap filling fluid covers, i.e. protects, the protected distal material layer, only the unprotected proximal material layer is removed, and not the protected distal material layer. This notwithstanding, it shall be understood that a limited amount of undercutting can occur during the etch such that in some embodiments, an edge region of the protected distal material layer can be etched even though most of the distal material layer is protected by the gap filling fluid. Further, it shall be understood that a limited amount of gap filling fluid, e.g. a thin film of gap filling fluid, can overly the unprotected material layer, with the understanding that this thin film of gap filling fluid is sufficiently thin as to not, or not substantially, shield the unprotected material layer from further etching steps.

In some embodiments, the plurality of super cycles are sequentially carried out in a single vacuum system, without any intervening vacuum breaks.

In some embodiments, the material layer comprises a solid material. Suitably, the solid material can comprise one or more elements selected from a transition metal, a rare earth metal, a post transition metal, and a group 14 element.

Suitable solid materials comprising a transition metal include Ti, Ta, Hf, V, Nb, Zr, Mo, Ru, Co, and W.

Suitable solid materials comprising a rare earth metal include Y, Er, and La.

Suitable solid materials comprising a post transition metal include Al, Sn, In, and Ga.

In some embodiments, the solid material comprises titanium. For example, the solid material can comprise one or more of titanium oxide, titanium nitride, and titanium nitride.

It shall be understood that the solid material does not have to be stoichiometric. In other words, and in some embodiments, the solid material may be a non-stoichiometric material. For example, titanium oxide can refer to TiO, $TiO_2$, $Ti_2O_3$, or to a non-stoichiometric titanium oxide.

In some embodiments, the solid material comprises one or more of a group 14 element oxide and a group 14 element nitride.

Suitable group 14 element oxides include silicon oxide, germanium oxide, and tin oxide.

Suitable group 14 element nitrides include carbon nitride, silicon nitride, germanium nitride, and tin nitride.

In some embodiments the solid material comprises a group 14 element oxycarbide. Suitable group 14 element oxycarbides include SiOC. It shall be understood that SiOC can refer to a non-stoichiometric solid material comprising silicon, oxygen, and carbon.

In some embodiments, the solid material comprises silicon. For example, the solid material can comprise one or more of silicon oxide, silicon nitride, and silicon carbonitride.

In some embodiments, the material layer comprises a d block metal oxide such as scandium oxide or a rare earth metal oxide such as lanthanum oxide.

In some embodiments, the material layer comprises a transition metal oxide such as hafnium oxide. In some embodiments, hafnium oxide can be deposited using an ALD process using a hafnium precursor and an oxygen reactant. Suitable hafnium precursors include hafnium halides such as $HfCl_4$ and alkylamido hafnium precursors such as Tetrakis(dimethylamido) hafnium (IV). Suitable oxygen reactants include $H_2O$.

In some embodiments, the material layer comprises silicon oxide.

In some embodiments, the material layer comprises silicon nitride.

In some embodiments, forming the material layer comprises executing a cyclical deposition process. The cyclical deposition process comprises a plurality of deposition cycles. A deposition cycle comprises a material layer precursor pulse and a material layer reactant pulse. The material layer precursor pulse comprises contacting the substrate with a material layer precursor. The material layer reactant pulse comprises contacting the substrate with a material layer reactant.

In some embodiments, the material layer has a step coverage of at least 10% to at most 500%, of at least 10% to at most 20%, or of at least 20% to at most 50%, or of at least 50% to at most 150%, or of at least 150% to at most 300%, or of at least 300% to at most 500%. It shall be understood that the term "step coverage" can refer to the growth rate of a layer on a distal surface of a gap, divided by the growth rate of that layer on a proximal surface, and expressed as a percentage. It shall be understood that a distal portion of a gap can refer to a portion of the gap which is relatively far removed from a substrate's surface, and that a proximal surface can refer to a part of the gap feature which is closer to the substrate's surface compared to the distal/lower/deeper portion of the gap feature.

A material layer having a desired thickness can be obtained by executing a pre-determined amount of material layer deposition cycles. The total number of cycles can depend, inter alia, on the total layer thickness that is desired. In some embodiments, at least one of a first layer and a second layer can be formed using from at least 2 cycles to at most 5 cycles, or from at least 5 cycles to at most 10 cycles, or from at least 10 cycles to at most 20 cycles, or from at least 20 cycles to at most 50 cycles, or from at least 50 cycles to at most 100 cycles, or from at least 100 cycles to at most 200 cycles, or from at least 200 cycles to at most 500 cycles, or from at least 500 cycles to at most 1000 cycles, or from at least 1000 cycles to at most 2000 cycles, or from at least 2000 cycles to at most 5000 cycles, or from at least 5000 cycles to at most 10000 cycles.

In some embodiments, the material layer has a thickness from at least 0.1 nm to at most 5 nm, or from at least 0.2 nm to at most 5 nm, or from at least 0.3 nm to at most 4 nm, or from at least 0.4 nm to at most 3 nm, or from at least 0.5 nm to at most 2 nm, or from at least 0.7 nm to at most 1.5 nm or of at least 0.9 nm to at most 1.0 nm, or of at least 1.0 nm to at most 2.0 nm, or of at least 2.0 nm to at most 5.0 nm, or of at least 5.0 nm to at most 10 nm, or of at least 10 nm to at most 20 nm, or of at least 20 to at most 50 nm.

It shall be understood that in some embodiments of any cyclic process as described herein, one or more subsequent pulses can be separated by a purge step. Providing purge steps between subsequent pulses can allow minimizing parasitic gas-phase reactions between precursors and reactants.

In some embodiments, the material layer reactant comprises an oxygen reactant. The oxygen reactant can be selected from $O_2$, $O_3$, $H_2O$, $H_2O_2$, $N_2O$, NO, $NO_2$, and $NO_3$.

In some embodiments, the material layer precursor comprises a rare earth element. Suitable rare earth elements include lanthanum, cerium, and praseodymium.

In some embodiments, the material layer precursor comprises a d block element. Suitable d block elements include scandium.

In some embodiments, the material layer precursor comprises a post transition metal such as aluminum.

In some embodiments, the material layer precursor comprises a halogen such as chlorine, bromine, or iodine.

In some embodiments, the material layer precursor comprises a carbon-containing ligand.

In some embodiments, partially filling the gap with a gap filling fluid comprises generating a plasma.

In some embodiments, partially filling the gap with a gap filling fluid comprises positioning the substrate on a substrate support comprised in a gap filling fluid reaction space. The gap filling fluid reaction space comprises a showerhead injector. It shall be understood that the plasma is generated between the substrate and the showerhead injector, and that partially filling the gap with a gap filling fluid further comprises providing a gap filling fluid precursor to the reaction space.

A showerhead injector can refer to a perforated plate through which at least one of a precursor, a reactant, and active species can be provided to a reaction space.

In some embodiments, the gap filling fluid precursor comprises a hydrocarbon. Suitable hydrocarbons include aromatic hydrocarbons such as toluene and trimethylbenzene.

In some embodiments, the gap filling fluid precursor comprises two or more anhydride functional groups. Suitable the gap filling fluid precursors include 1,2,4,5-Benzenetetracarboxylic anhydride.

In some embodiments, the gap filling fluid precursor comprises at least one of a carbonyl group and a hydroxyl group. In some embodiments, the gap filling fluid precursor can comprises a carbonyl group and a hydroxyl group. Examples of such precursors include 2-Hydroxy-2-methylpropiophenone.

In some embodiments, the gap filling fluid comprises a heterocyclic organic compound. Suitable heterocyclic organic compounds include pyridine.

In some embodiments, the gap filling fluid reactant comprises two or more amine functional groups. Suitable gap fill reactants include ethylenediamine, 1,6-diaminohexane, 1,4-phenylenediamine, and 4,4'-oxydianiline.

In some embodiments, forming the gap filling fluid can comprise generating a plasma in the reaction chamber. In some embodiments, the plasma is generated intermittently. In some embodiments, a pulsed plasma, e.g. a pulsed RF plasma is generated in the reaction chamber. Thus, the method comprises a plurality of cycles, a cycle comprising a plasma on pulse and a plasma off pulse. In some embodiments, a plasma on pulse lasts from at least 0.7 seconds to at most 2.0 seconds, for example from at least 0.7 seconds to at most 1.5 seconds. In some embodiments, a plasma off pulse lasts from at least 0.7 seconds to at most 2.0 seconds, for example from at least 0.7 seconds to at most 1.5 seconds. In some embodiments, the plasma is generated continuously.

In some embodiments, partially filling the gap with a gap filling fluid comprises a sequence of a gap filling fluid fill step and a gap filling fluid etch step. For example, the gap can be entirely filled with the gap filling fluid, and the gap can then be partially removed using, for example, a plasma treatment such as a direct oxygen plasma.

In some embodiments, the gap filling fluid comprises an oligomeric compound. For example, an oligomeric compound can comprise one or more elements selected from C, O, H, N, Si, and S. In some embodiments, the gap filling fluid can consist of carbon and hydrogen. In some embodiments, the gap filling fluid has a molar mass from at least 100 to at most 100 000 g/mol, such as from at least 100 to at most 1000 g/mol, or from at least 1000 to at most 10000 g/mol or from at least 10000 to at most 100000 g/mol.

Suitable gap filling fluids include carbon-containing polymers such as polyimides, polyketone polyvinyl toluene, polyethylene, polypropylene, polyaramids, polyimides, polystyrene, polyamic acids, and polymethyl methacrylate, and combinations thereof. In some embodiments, the gap filling fluid comprises a plurality of imide functional groups.

In some embodiments, the unprotected proximal material layer can be etched selectively with respect to the gap filling fluid by a suitable etchant. Alternatively, and in some embodiments, selectively etching the unprotected proximal material layer comprises a first step of converting the unprotected proximal material layer into a converted material layer; and a second step of selectively etching the converted material layer vis-à-vis the gap filling fluid.

In some embodiments, the solid material comprises silicon nitride. In such embodiments, the converting step can suitably comprise generating an oxygen plasma, the converted material layer can comprise silicon oxide, and the selective etching step can comprise exposing the substrate to a fluorine species. Exemplary fluorine species include fluorine radicals. In some embodiments, the fluorine species comprise aqueous HF.

In some embodiments, the fluorine species comprise fluorine radicals. In some embodiments, the fluorine radicals can be generated in a remote plasma.

In some embodiments, the gap filling fluid can be formed using a method and apparatus as described in U.S. Pat. No. 10,695,794B2.

In some embodiments, the gap filling fluid can be formed using a method and apparatus as described in U.S. Pat. No. 7,825,040B1. In some embodiments, the gap filling fluid can be formed using a method and apparatus as described in any one of the following patent applications having publication number US20220119944A1, US20210249303A1, US2015056821A1, and US2014363983A1.

In some embodiments, forming the gap filling fluid comprises exposing the substrate to a gap fill precursor and exposing the substrate to a gap fill reactant. In some embodiments, the substrate is simultaneously exposed to the gap fill precursor and the gap fill reactant.

In some embodiment, forming the gap filling fluid comprises generating a plasma. The plasma can be generated in the reaction chamber or in a separate plasma chamber, i.e. a remote plasma unit, that is operationally connected to the reaction chamber in which the gap filling fluid is formed. The plasma can be generated in a direct plasma configuration, an indirect plasma configuration, or a remote plasma configuration, as described herein.

In some embodiments, forming the gap filling fluid is done thermally. For example, a polyimide gap filling fluid can be formed thermally.

In some embodiments, forming the material layer, forming the gap filling fluid, etching the material layer, and removing the gap filling fluid are all done in absence of a plasma. In other words, forming the material layer, forming the gap filling fluid, etching the material layer, and removing the gap filling fluid can be done thermally, in some embodiments. In other words, and in some embodiments, the methods described herein do not include use of a plasma to form activated species for use in a material formation or etch process.

In some embodiments, a gap filling fluid can be formed using a cyclical deposition process comprising a plurality of gap fill deposition cycles. A gap fill deposition cycle comprises a gap fill precursor pulse and a gap fill reactant pulse. A gap fill precursor pulse comprises exposing the substrate to a gap fill precursor. A gap fill reactant pulse comprises exposing the substrate to a gap fill reactant.

In exemplary embodiment, the gap fill precursor comprises 1,2,4,5-Benzenetetracarboxylic anhydride (PMDA) and the gap fill reactant comprises 1,6-diaminohexane (DAH). Such a precursor-reactant pair can be employed for cyclically forming a polyimide gap filling fluid using a substrate temperature of at least 150° C. to at most 200° C. and a reaction chamber pressure of at least 0.1 Torr to at most 50 Torr. Suitable PMDA pulse times include from at least 100 ms to at most 20000 ms. Suitable DAH pulse times include from at least 50 ms to at most 10000 ms. A PMDA pulse can be followed by a PMDA purge that can last, for example, from at least 1000 to at most 30000 ms. A DAH pulse can be followed by a DAH purge that can last, for example, from at least 1000 to at most 20000 ms.

Of course, other suitable gap fill precursors or reactants could be used. For example, 1,4-phenylenediamine could be used as a gap fill reactant instead.

A flowable polyimide material can have excellent etch resistance against diluted aqueous HCl and against diluted aqueous HF. Such etchants can etch dipole materials and high-k dielectrics such as metal oxides. Accordingly, such etchants can be used for selectively etching at least one of a dipole material and a high-k dielectric vis-à-vis a polyimide gap filling fluid.

In some embodiments, partially filling the gap with the gap filling fluid comprises: forming a reflowable material in the gap; and, annealing the substrate to a temperature in excess of a pre-determined temperature. For example, the pre-determined temperature can be a melting point or, in case the gap filling fluid exhibits non-Newtonian fluid behavior, a softening temperature. Thus, the reflowable material is at least partially melted to form the gap filling fluid that at least partially fills the gap.

In some embodiments, the reflowable material comprises one or more voids. Indeed, the reflowable material may be not, or not very, flowable under the conditions at which it is formed. Thus, voids can be formed during the deposition of the reflowable material. When the reflowable material is heated, it can soften, melt, or partially melt such that the material can reflow into the gap, and the voids consequentially disappear.

Suitable annealing treatments include anneals in a nitrogen or noble gas containing atmosphere. Suitable annealing temperatures can include the range of at least 100° C. to at most 500° C., such as at least 200° C. to at most 400° C., or at least 250° C. to at most 350° C.

In some embodiments, removing the gap filling fluid from the substrate comprises generating an oxygen plasma. For example, the gap filling fluid can be removed by means of a direct, indirect, or remote oxygen plasma. It shall be understood that an oxygen plasma refers to a plasma that employs a plasma gas that comprises oxygen.

In some embodiments, removing the gap filling fluid from the substrate comprises generating a hydrogen plasma. For example, the gap filling fluid can be removed by means of a direct, indirect, or remote hydrogen plasma. It shall be understood that a hydrogen plasma refers to a plasma that employs a plasma gas that comprises hydrogen.

In some embodiments, removing the gap filling fluid from the substrate comprises generating a nitrogen plasma. For example, the gap filling fluid can be removed by means of a direct, indirect, or remote nitrogen plasma. It shall be understood that a nitrogen plasma refers to a plasma that employs a plasma gas that comprises nitrogen.

In some embodiments, removing the gap filling fluid from the substrate comprises exposing the substrate to a solvent. Advantageously, removing the gap filling fluid by means of a solvent can prevent or substantially avoid damaging the material layer. In addition, such a step can be particularly cost-effective. Suitable solvents include ketones such as acetone, alkyl alcohols such as methanol and ethanol, aromatic compounds including alkyl-substituted aromatic compounds such as toluene, haloalkanes such as trichloromethane, and cyclic alkyls such as hexane. In some embodiments, the gap filling fluid comprises toluene oligomers and the solvent includes toluene.

Without wishing to be bound by any particular theory or mode of operation, it is believed that gap filling fluids, and especially gap filling fluids substantially comprising carbon and hydrogen, can comprise oligomers which are weakly bonded to each other such that they can be easily dissolved in a suitable solvent.

In some embodiments, removing the gap filling fluid from the substrate comprises heating the substrate to a temperature which is above the evaporation temperature of the gap filling fluid.

Suitably, etching the material layer comprises selectively etching the material layer vis-à-vis the gap filling fluid and vis-à-vis the underlying substrate.

In some embodiments, etching the material layer employs a wet etch. Indeed, flowable material as used herein can have a low wet etch rate vis-à-vis acidic etchants such as aqueous hydrogen fluoride (HF) and aqueous hydrogen chloride (HCl) and basic etchants such as ammonia solution, i.e. $NH_3$ (aq), whereas material layers as described herein can have a substantial etch rate when exposed to such etchants. Thus, such etchants can be advantageously used for etching material layers in accordance with the methods as described herein.

In some embodiments, etching the material layer can comprise generating a plasma. For example, etching the material layer can comprise employing an $NF_3$ plasma such as an $NF_3$ remote plasma. It shall be understood that an $NF_3$ plasma refers to a plasma in which the plasma gas comprises $NF_3$. $NF_3$ remote plasma etches can be employed for etching material layers that comprise a material selected from the list comprising silicon oxide, silicon nitride, silicon oxycarbide, and transition metal oxides such as titanium oxide.

In some embodiments, the material layer can be exposed to a plasma treatment after it is deposited. The plasma treatment can be carried out before or after etching the gap filling fluid. When a method as described herein is carried out cyclically, i.e. for gap filling purposes, exposing the material layer to the plasma treatment can be done during each deposition cycle, during a part of the deposition cycles, or after the gap has been filled with the solid material.

Suitably, the material layer can be treated by means of a direct, indirect, or remote plasma. Suitable plasmas can employ a plasma gas comprising $N_2$. Additionally or alternatively, the plasma gas can comprise He. Additionally or alternatively, the plasma gas can comprise $N_2$ and He. For example the material layer can be treated using a direct plasma in which the plasma gas comprises $N_2$. Advantageously, such plasmas can reduce the wet etch rate in an etchant such as 1.5 volume percent aqueous HF.

In some embodiments, exposing the material layer to a plasma treatment is done after removal of the gap filling fluid, without any intervening vacuum break.

Further described herein is a semiconductor processing facility that comprises a material layer deposition reactor, a gap filling fluid formation reactor, a material layer etching reactor, a gap filling fluid removal reactor, a substrate moving robot, and a controller. The controller is arranged to receive computer-readable instructions which, when carried out, cause the semiconductor processing facility to carry out a method as described herein.

Further described herein is a substrate processing system. The substrate processing system comprises a gap fill reaction chamber, a gap fill etching chamber, a material layer deposition chamber, a material layer etching chamber, and a wafer transfer robot. The wafer transfer robot is arranged for moving a wafer between the gap fill reaction chamber, the gap fill etching chamber, the material layer deposition chamber, and the material layer etching chamber, without any intervening vacuum break. The gap fill reaction chamber is arranged for forming a gap filling fluid on the wafer. The gap fill etching chamber is arranged for removing the gap filling fluid from the wafer. The material layer deposition chamber is arranged for forming a material layer on the wafer. The material layer etching chamber is arranged for partially removing the material layer from the wafer. The substrate processing system further comprises a controller that is arranged for causing the substrate processing system to carry out a method as described herein.

FIGS. 1A-1F schematically show incremental results of process steps in an embodiment of a method as disclosed herein.

In particular, FIG. 1A shows a structure (100) that comprises a gap (105) that is formed in a substrate (110). The gap (105) comprises a distal portion (106) and sidewalls (107). Outside of the gap (105), the substrate (110) comprises a proximal surface (111).

Figure 1B:
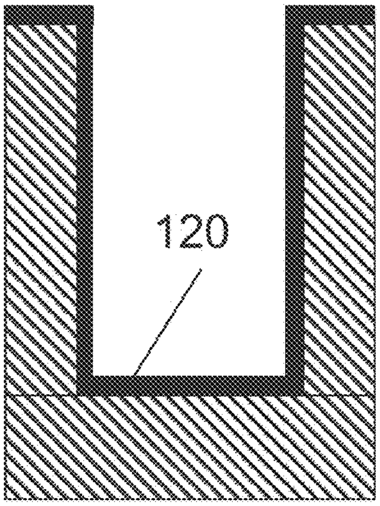

FIG. 1B shows how a material layer (120) is formed overlying the substrate, and covering the proximal surface (111), the distal portion (106), and the sidewalls (107). In some embodiments, the material layer (120) can have a constant thickness, e.g. within a margin of error of 1.0, 2.0, 5.0, or 10.0 percent. Suitably, the material layer (120) can be formed using a cyclical deposition process such as a plasma-enhanced atomic layer deposition process.

Figure 1C:
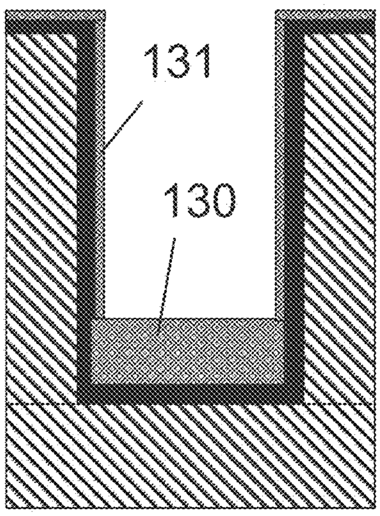

FIG. 1C shows how a gap filling fluid (130) is formed in the gap (105). Suitable gap filling fluids (130) include carbon and hydrogen-containing oligomers, and can be formed using, for example, plasma-enhanced chemical vapor deposition using a hydrocarbon precursor, such as a hydrocarbon precursor comprising two or more carbon-carbon double bonds, such as toluene. It shall be understood that after a gap filling fluid formation step, more of the gap filling fluid is located at the bottom of the gap (105), i.e. on the gap's distal portion (106), than on the sidewalls (107) and on the proximal surface (111). This notwithstanding, a minor amount of gap filling fluid, a so-called wetting layer (131), can be present on the sidewalls (107) and on the proximal surface (111). It is minor in the sense that more gap filling fluid, i.e. a higher thickness of gap filling fluid, is located on the gap's distal portion (106) compared to the sidewalls (107) and the proximal surface (111).

Figure 1D:
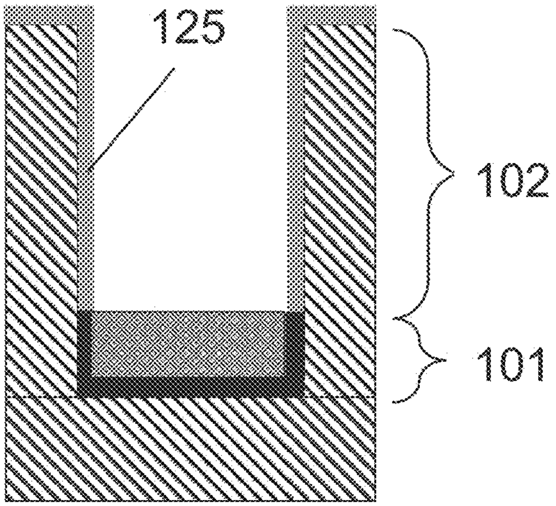

FIG. 1D shows how the material layer (120) can be transformed into a modified material layer (125) where it is not protected by the gap filling fluid (130), i.e. on the sidewalls (107) and on the proximal surface (111). Note that as illustrated, the wetting layer (131) on the sidewalls (107) and the proximal surface (111), is removed by the transformation treatment, but the thicker/higher amount of gap filling fluid (130) at the distal surface (106) is not removed by the transformation treatment and efficiently shields the material layer (120) located on that distal surface (106) from the transformation treatment such that it is not modified by that treatment.

Figure 1E:
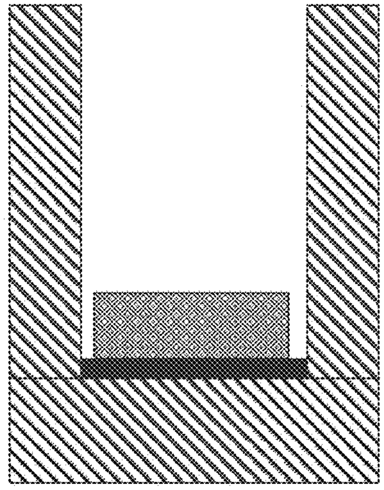

FIG. 1E shows the structure (100) after selectively etching the modified material layer vis-à-vis the gap filling fluid and the unmodified part of the material layer (120). After such an etch, only a portion of the material layer (120) on the distal surface (160) remains, being protected from the etch by the gap filling fluid (130), while the remaining part of the material layer (120) is etched away.

Figure 1F:
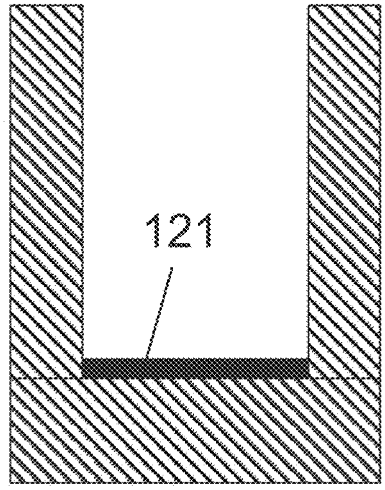

FIG. 1F shows the structure (100) after the gap filling fluid (130) has been selectively removed vis-à-vis the substrate (110) and the remaining part of the material layer (121). The remaining part of the material layer (120) forms a distal layer (121).

FIGS. 2A-2F schematically show incremental results of process steps in an embodiment of a method as disclosed herein. FIGS. 2A-2F are very similar to FIGS. 1A-F, except for a few key aspects.

Figure 2A:
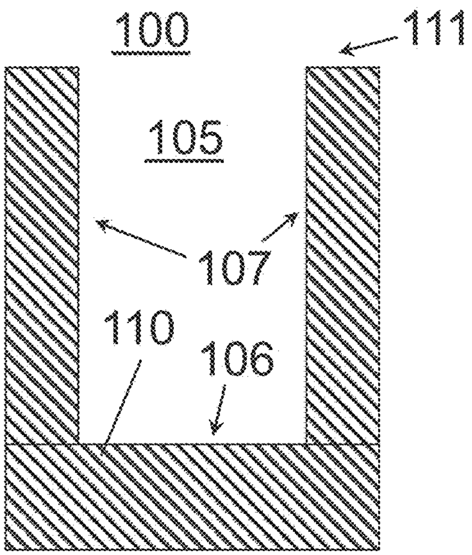
Figure 2B:
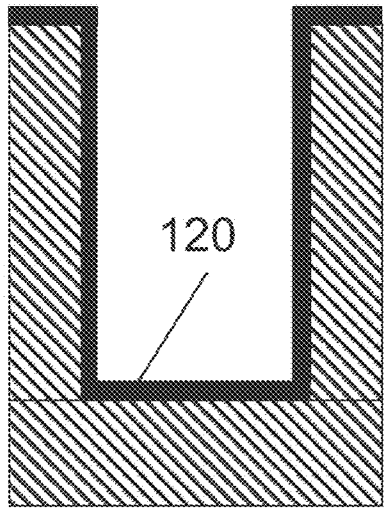
Figure 2C:
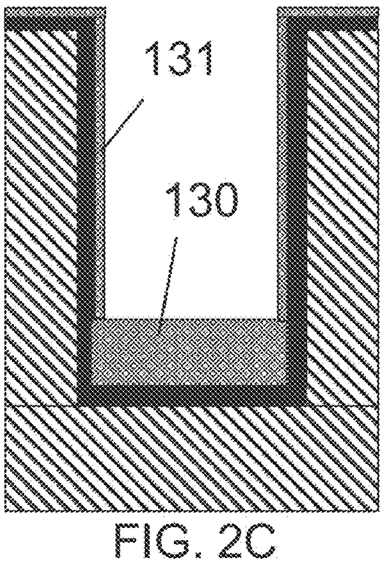

In particular, FIGS. 2A-2C are identical to FIGS. 1A-1C, respectively. The transformation treatment is omitted in the embodiment of FIGS. 2A-2F.

Figure 2D:
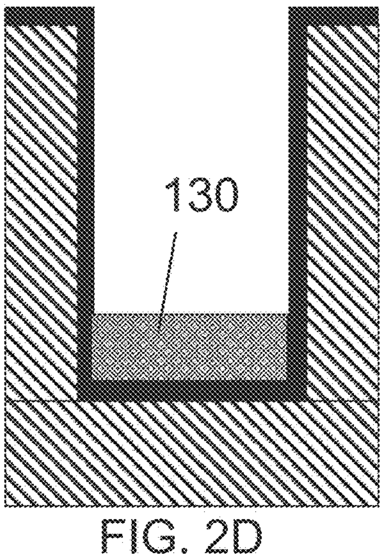

FIG. 2D shows the structure (100) after removal of the wetting layer. A wetting layer can be suitably removed by a wetting layer removal treatment. A wetting layer removal treatment can, for example, comprise exposing the substrate to a direct oxygen plasma.

Figure 2E:
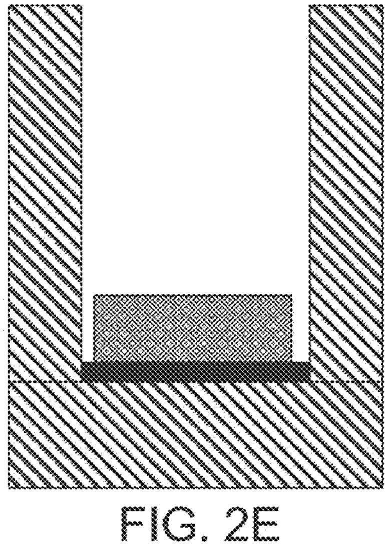

FIG. 2E shows the structure (100) after selectively etching the material layer vis-à-vis the gap filling fluid. During the etch, the part of the material layer on the distal surface (106) is protected from the etchant by the gap filling fluid (130), and is therefore not etched, even though the part of the material layer on the distal surface (106) on the one hand and the rest of the material layer on the other hand have a substantially identical composition, and therefore have a substantially identical etch rate. After such an etch, only a portion of the material layer (120) on the distal surface (160) remains, being protected from the etch by the gap filling fluid (130), while the remaining part of the material layer (120) is etched away.

Figure 2F:
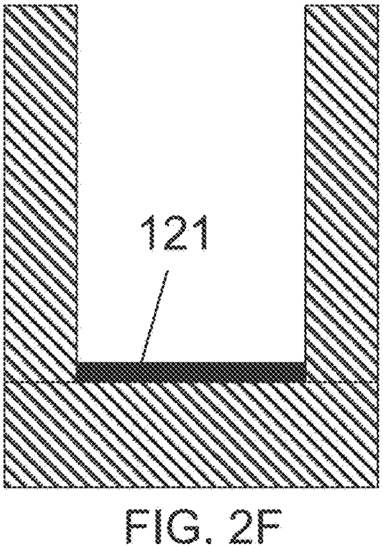

FIG. 2F shows the structure (100) after the gap filling fluid (130) has been selectively removed vis-à-vis the substrate (110) and the remaining part of the material layer (121). The remaining part of the material layer (120) forms a distal layer (121).

In some embodiments, the material layer (120) can be a silicon nitride layer. In such embodiments, the gap filling fluid can suitably comprise, or can substantially consist of, hydrocarbon oligomers such as oligomeric toluene. Forming a modified material layer (125) can then suitably comprise generating a plasma, such as a direct oxygen plasma, i.e. a plasma using a plasma gas that comprises oxygen. Etching the modified material layer (125) can comprise executing a wet etch, such as an etch in aqueous HF, e.g. aqueous HF having an HF concentration of 1.5 vol. %. Removing the gap filling fluid can comprise generating a plasma such as a direct plasma, such as a direct $Ar/H_2$ or $N_2/H_2$ plasma, i.e. a direct plasma using a plasma gas that comprises argon and $H_2$, or $N_2$ and $H_2$.

Figure 3:
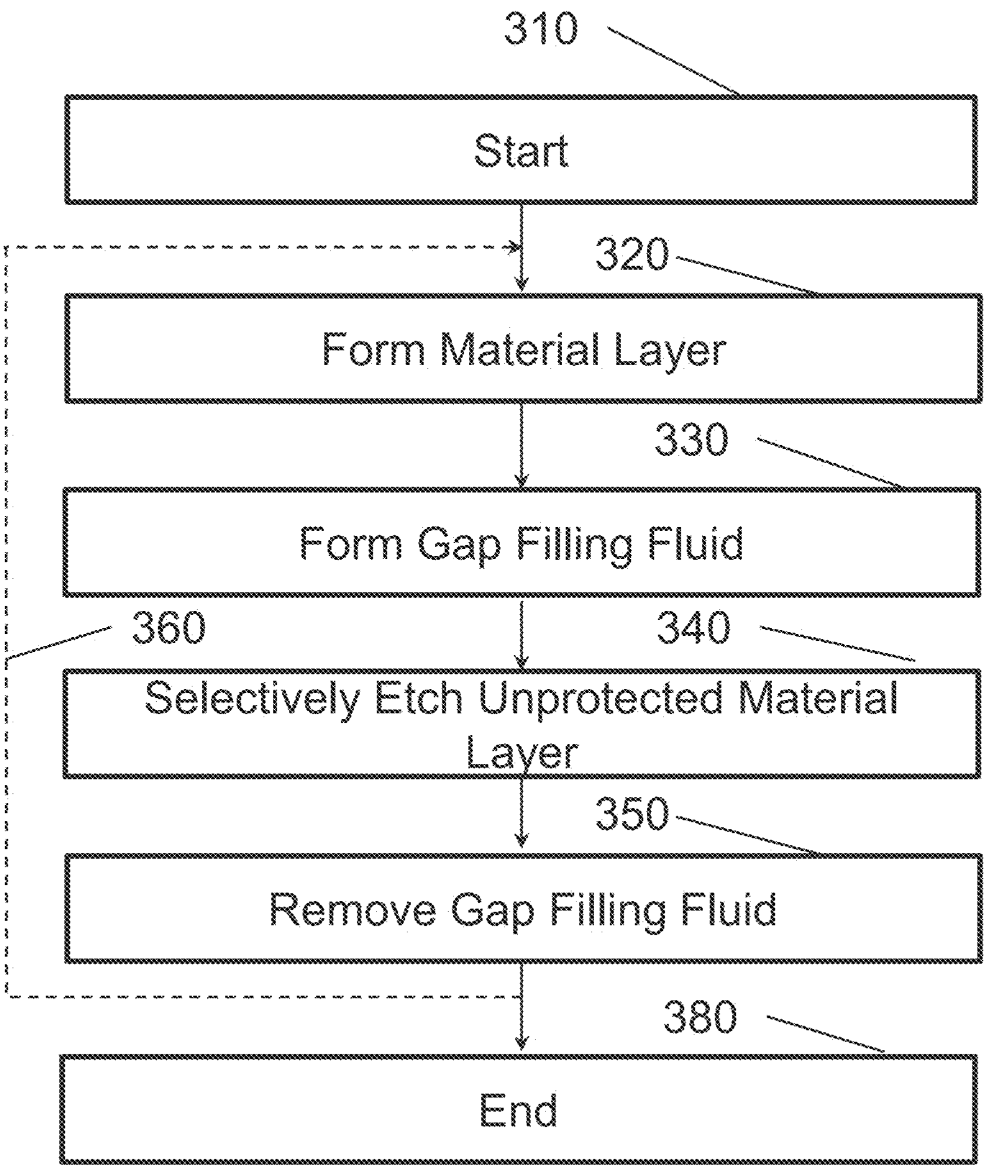

In a further exemplary embodiment, reference is made to FIG. 3. FIG. 3 schematically shows a flow chart of an embodiment of a method as described herein. Such a substrate comprises a gap formed in a substrate material. The gap comprises a lower part and an upper part.

A method according to the embodiment shown in FIG. 3 starts (310) and comprises a step (320) of forming a material layer. The material layer can be formed using a conformal deposition technique. Suitable conformal deposition techniques include cyclical deposition techniques such as atomic layer deposition (ALD).

The method according to the embodiment shown in FIG. 3 further comprises a step (330) of forming a gap filling fluid. The gap filling fluid can be formed to partially fill the gap. In some embodiments, the gap filling fluid can be formed to fill a substantial portion of the gap, such as the entire gap, and it can then be partially etched such that, after the etch, it only fills a distal portion of the gap. Suitable gap filling fluids are described elsewhere herein and include carbon-containing oligomers. The material layer on the distal portion of the gap is thus covered by the gap filling fluid. We refer to this portion of the material layer as the protected material layer. The material layer on the sidewalls of the gap is thus not, or not substantially, covered by the gap filling fluid. We refer to this portion of the material layer as the unprotected material layer. It shall be understood that, in some embodiments, a minor amount of gap filling fluid can be present on the unprotected material layer. It shall be understood that this minor amount of gap filling fluid is insufficient to substantially shield the unprotected material layer against a chemical treatment such as an etch.

The method according to the embodiment shown in FIG. 3 further comprises a step (340) of selectively etching the unprotected material layer vis-à-vis the gap filling fluid. The gap filling fluid protects the protected material layer at the distal portion of the gap. Thus, the unprotected material layer in the proximal part of the gap is etched away during an etch while the protected material layer in the distal part of the gap is protected by the gap filling fluid and is left intact. It shall be understood that in an ideal case, all the material layer is removed from the sidewalls of the gap, and the material layer remains present on the distal surface of the gap. This notwithstanding, and in some embodiments, a minor amount of material layer may remain on the most distal end of the sidewalls of the gap, for example extending from the distal portion of the gap along the sidewalls of the gap over a distance that equals the thickness of the gap filling fluid before that is removed. Indeed, real gap filling fluids have a finite, non-zero thickness, so they can also protect a minor amount of material layer that is present on the sidewalls of the gap, which is consequently not removed in an etch.

In an advantageous embodiment, the gap filling fluid is first formed to entirely fill the gap, and the gap filling fluid is then partially recessed such that it only partially fills the gap. This advantageously ensures that no wetting layer is present when the material layer is etched, and such a procedure can be advantageous for ensuring that gaps having different aspect ratios are uniformly filled, as is shown in FIGS. 12A-12D.

Then, the gap filling fluid is removed (350). In some embodiments, the method according to the embodiment of FIG. 3 can end (380) at this point in the process, in which case a distal layer has been selectively formed on the distal surface of the gap, and not (or not substantially) on its sidewalls. Alternatively, the method according to the embodiment of FIG. 3 can comprise a plurality of super cycles (360). Ones from the plurality of super cycles (360) comprise the material layer formation step (320), the gap filling fluid formation step (330), the material layer etching step (340), and the gap filling fluid removal step (350). By executing a plurality of super cycles (360), the gap can be filled partially or wholly with a material comprised in the material layer.

Figure 4:
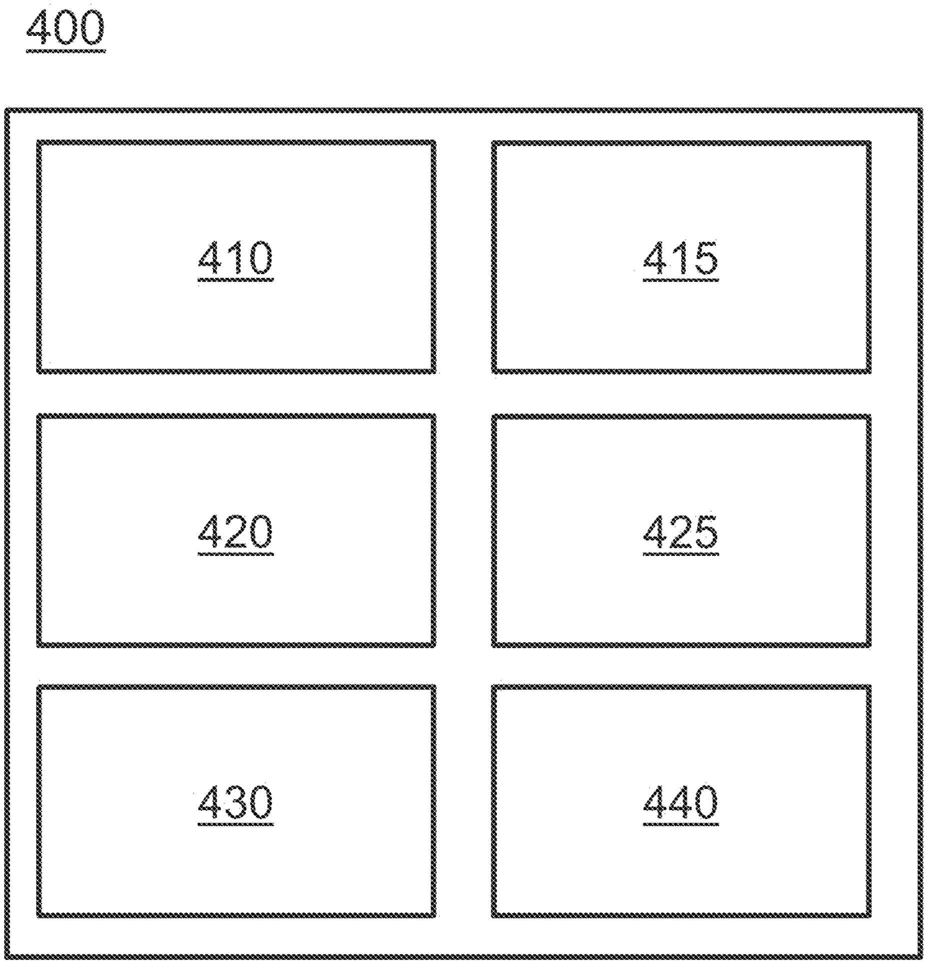
FIG. 4 shows an embodiment of a substrate processing system (400).

FIG. 4 shows an embodiment of a substrate processing system (400). The substrate processing system (400) comprises a gap fill reaction chamber (410). The gap fill reaction chamber (410) is arranged for forming a gap filling fluid on a substrate. The substrate processing system (400) further comprises a gap fill etching chamber (415). The gap fill etching chamber (415) is arranged for removing the gap filling fluid from the substrate. The substrate processing system (400) further comprises a material layer reaction chamber (420). The material layer reaction chamber (420) is arranged for forming a material layer on the substrate. The substrate processing system (400) further comprises a material layer etching chamber (425). The material layer etching chamber (425) is arranged for at least partially removing the material layer from the substrate. The substrate processing system (400) further comprises a wafer transfer robot (430). The wafer transfer robot (430) is arranged for moving a wafer between the gap fill reaction chamber, the gap fill etching chamber, the material layer reaction chamber, and the material layer etching chamber, without any intervening vacuum break. The substrate processing system (400) further comprises a controller (440). The controller (440) is arranged for causing the substrate processing system to carry out a method as described herein.

Figure 5:
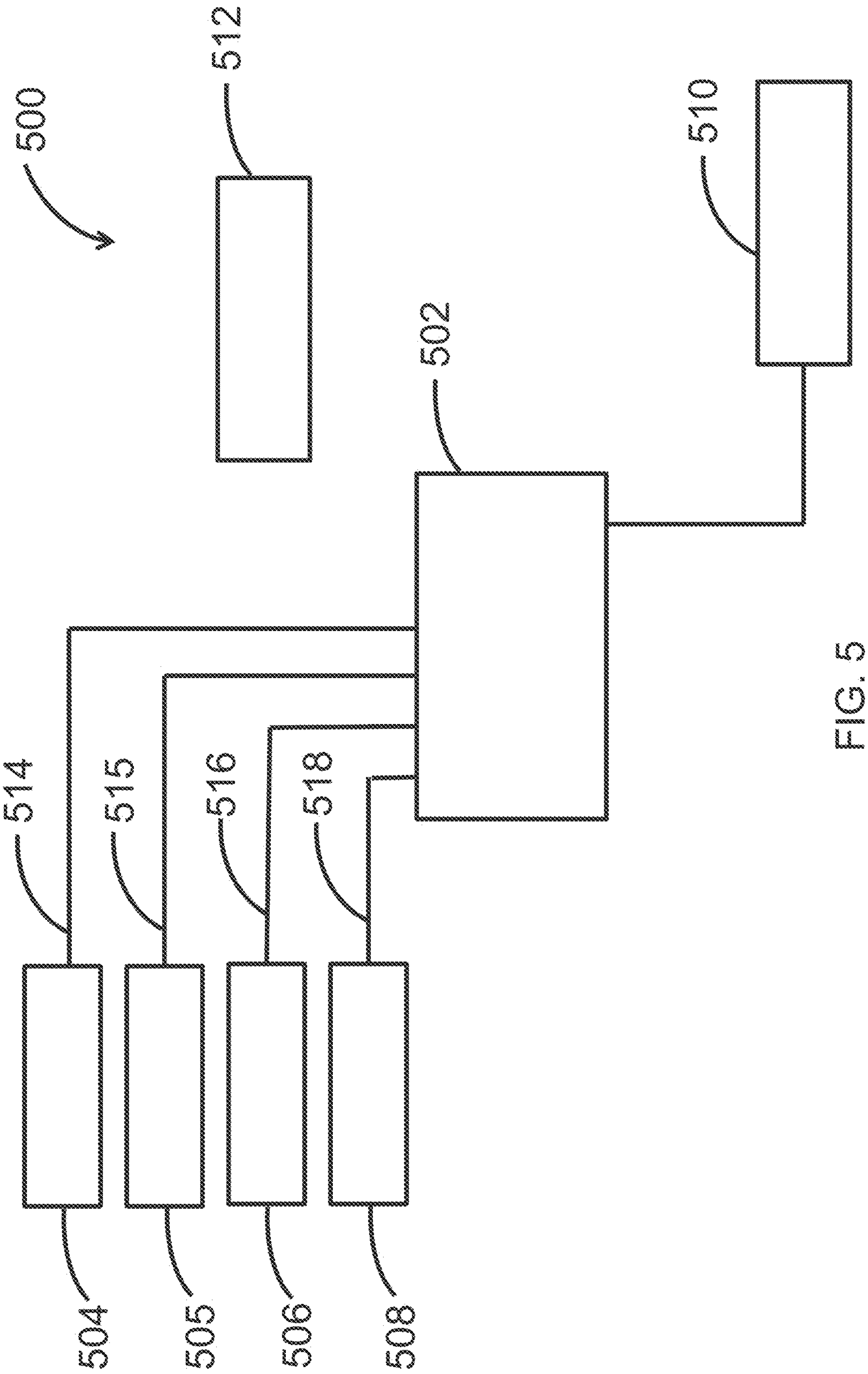
FIG. 5 illustrates a sub-system (500) in accordance with yet additional exemplary embodiments of the disclosure.

FIG. 5 illustrates a sub-system (500) in accordance with yet additional exemplary embodiments of the disclosure. The sub-system (500) can be used to form a material layer in an embodiment of a method as described herein.

In the illustrated example, the sub-system (500) includes one or more reaction chambers (502), a material layer precursor gas source (504), a material layer reactant gas source (506), a purge gas source (508), an exhaust (510), and a controller (512).

The reaction chamber (502) can include any suitable reaction chamber, such as an ALD or CVD reaction chamber.

The material layer precursor gas source (504) can include a vessel and one or more precursors as described herein-alone or mixed with one or more carrier (e.g., noble) gases. The material layer reactant gas source (506) can include a vessel and one or more reactants as described herein-alone or mixed with one or more carrier gases. The purge gas source (508) can include one or more noble gases as described herein. Although illustrated with three gas sources (504)-(508), the system (500) can include any suitable number of gas sources. The gas sources (504)-(508) can be coupled to reaction chamber (502) via lines (514)-(518), which can each include flow controllers, valves, heaters, and the like.

The exhaust (510) can include one or more vacuum pumps.

The controller (512) includes electronic circuitry and software to selectively operate valves, manifolds, heaters, pumps and other components included in the system (500). Such circuitry and components operate to introduce precursors and purge gases from the respective sources (504)-(508). The controller (512) can control timing of gas pulse sequences, temperature of the substrate and/or reaction chamber, pressure within the reaction chamber, and various other operations to provide proper operation of the sub-system (500). The controller (512) can include control software to electrically or pneumatically control valves to control flow of precursors, reactants and purge gases into and out of the reaction chamber (502). The controller (512) can include modules such as a software or hardware component, e.g., a FPGA or ASIC, which performs certain tasks. A module can advantageously be configured to reside on the addressable storage medium of the control system and be configured to execute one or more processes.

Other configurations of the sub-system (500) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (502). Further, as a schematic representation of a system, many components have been omitted for simplicity of illustration, and such components may include, for example, various valves, manifolds, purifiers, heaters, containers, vents, and/or bypasses.

During operation of the sub-system (500), substrates, such as semiconductor wafers (not illustrated), are transferred from, e.g., a substrate handling system to the reaction chamber (502). Once substrate(s) are transferred to the reaction chamber (502), one or more gases from the gas sources (504)-(508), such as precursors, reactants, carrier gases, and/or purge gases, are introduced into the reaction chamber (502).

Figure 6:
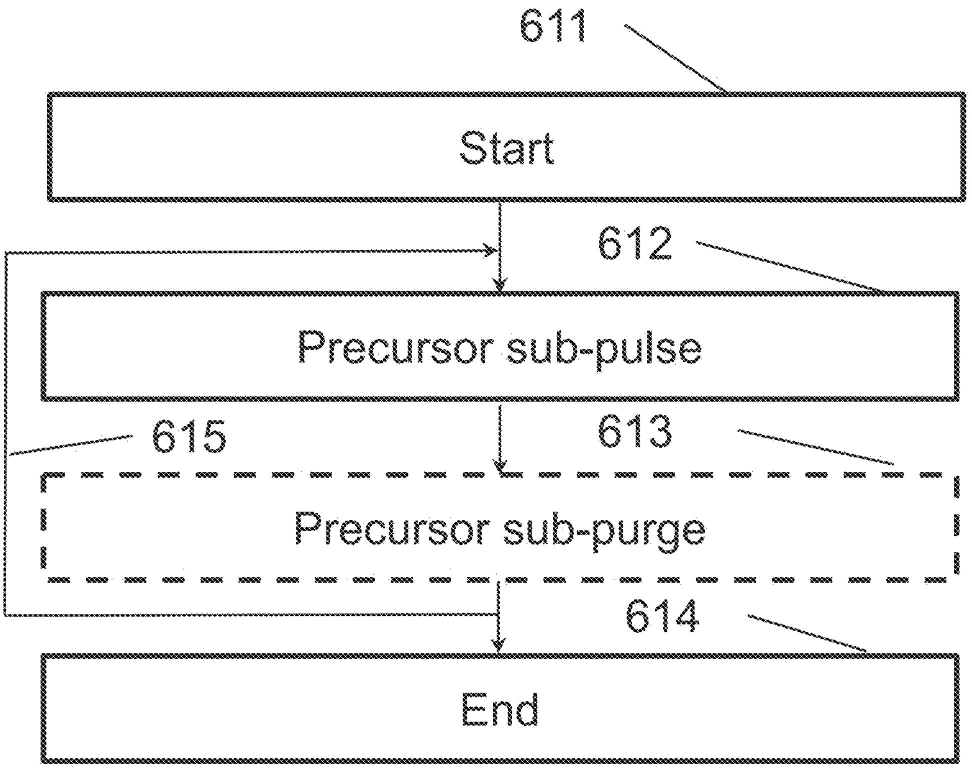
FIG. 6 shows an embodiment of a precursor pulse, e.g. a gap fill precursor pulse, a first precursor pulse, or a second precursor pulse according to an exemplary method as disclosed herein.

FIG. 6 shows an embodiment of a precursor pulse, e.g. a gap fill precursor pulse, a first precursor pulse, or a second precursor pulse according to an exemplary method as disclosed herein. The precursor pulse starts (611) and a precursor sub-pulse (612) is carried out. The precursor sub-pulse is then followed by a precursor sub-purge (613). The precursor sub-pulse (612) and the precursor sub-purge (613) are then repeated (615) for a pre-determined amount of times, e.g. from at least 1 to at most 10 times, until the precursor pulse ends (614).

Figure 7:
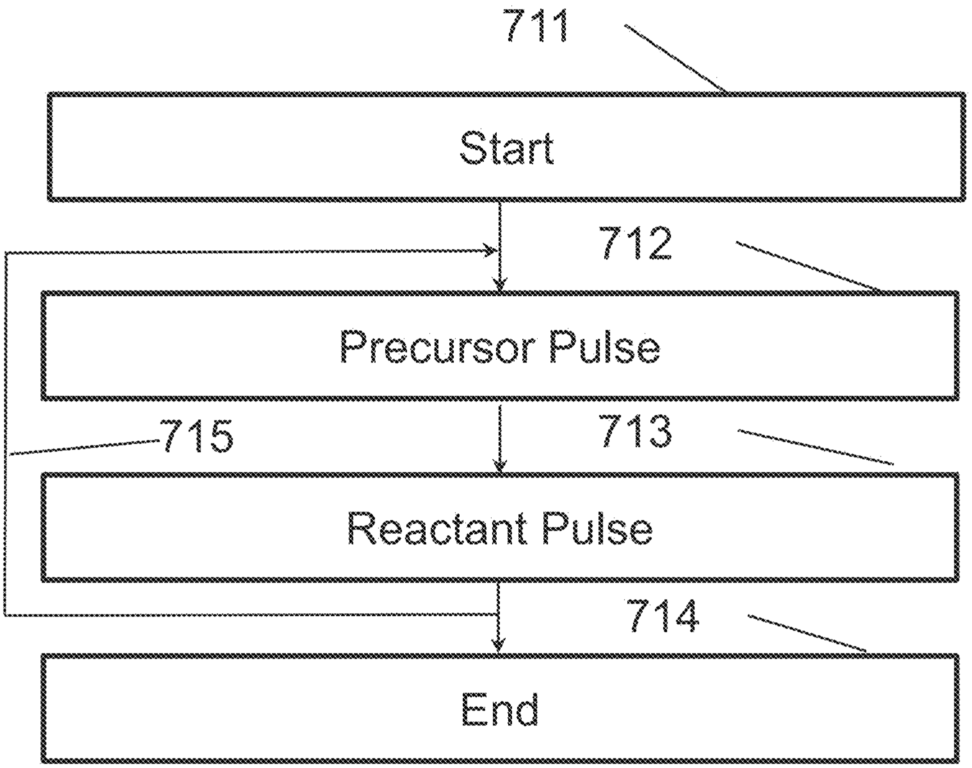
FIG. 7 shows an embodiment of a cyclical deposition process such as a cyclical deposition process for forming a material layer or a gap filling fluid.

FIG. 7 shows an embodiment of a cyclical deposition process such as a cyclical deposition process for forming a material layer or a gap filling fluid. The method (700) starts (711) by providing a substrate. Then, a plurality of deposition cycles (715) are carried out. A deposition cycle (715) comprises a precursor pulse (712) and a reactant pulse (713). After a pre-determined amount of deposition cycles (715), the method ends (714).

Figure 8:
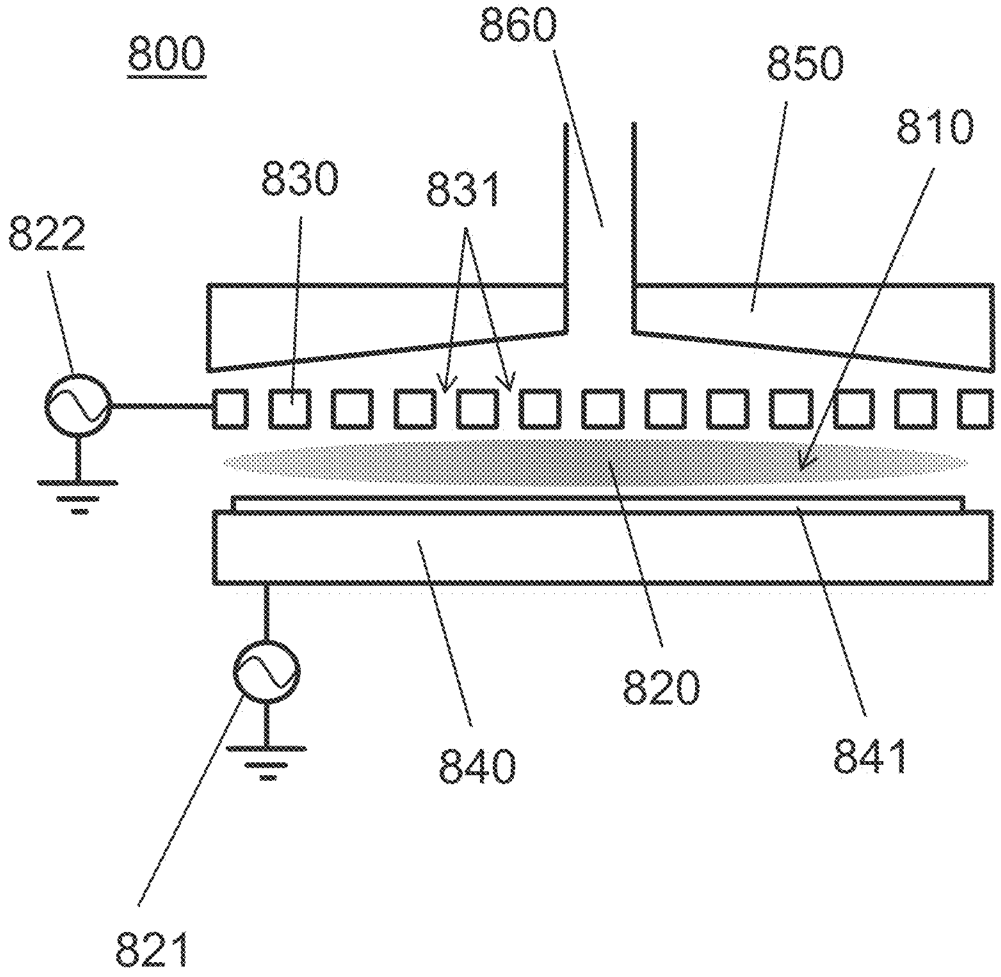
FIG. 8 shows a schematic representation of an embodiment of another sub-system (800) as described herein.

FIG. 8 shows a schematic representation of an embodiment of another sub-system (800) as described herein. It can be used, for example, for forming one or more of a material layer and a gap filling fluid. Additionally or alternatively, it can be employed for etching one or more of a gap filling fluid and a material layer. The sub-system (800) comprises a reaction chamber (810) in which a plasma (820) is generated. In particular, the plasma (820) is generated between a showerhead injector (830) and a substrate support (840). This is a direct plasma configuration employing a capacitively coupled plasma.

In the configuration shown, the sub-system (800) comprises two alternating current (AC) power sources: a high frequency power source (821) and a low frequency power source (822). In the configuration shown, the high frequency power source (821) supplies radio frequency (RF) power to the showerhead injector, and the low frequency power source (822) supplies an alternating current signal to the substrate support (840). The radio frequency power can be provided, for example, at a frequency of 13.56 MHz or higher, e.g. at a frequency of at least 100 kHz to at most 50 MHz, or at a frequency of at least 50 MHz to at most 100 MHz, or at a frequency of at least 100 MHz to at most 200 MHz, or at a frequency of at least 200 MHz to at most 500 MHz, or at a frequency of at least 500 MHz to at most 1000 MHz, or at a frequency of at least 1000 MHz to at most 2000 MHz. The low frequency alternating current signal can be provided, for example, at a frequency of 2 MHz or lower, such as at a frequency of at least 100 kHz to at most 200 kHz, or at a frequency of at least 200 kHz to at most 500 kHz, or at a frequency of at least 500 kHz to at most 1000 kHz, or at a frequency of at least 1000 kHz to at most 2000 kHz. Process gas comprising precursor, reactant, or both, is provided through a gas line (860) to a conical gas distributor (850). The process gas then passes through holes (831) in the showerhead injector (830) to the reaction chamber (810).

Whereas the high frequency power source (821) is shown as being electrically connected to the showerhead injector, and the low frequency power source (822) is shown as being electrically connected to the substrate support (840), other configurations are possible as well. For example, in some embodiments (not shown), both the high frequency power source and the low frequency power source can be electrically connected to the showerhead injector; or both the high frequency power source and the low frequency power source can be electrically connected to the substrate support; or the high frequency power source can be electrically connected to the substrate support, and the low frequency power source can be electrically connected to the showerhead injector.

Figure 9:
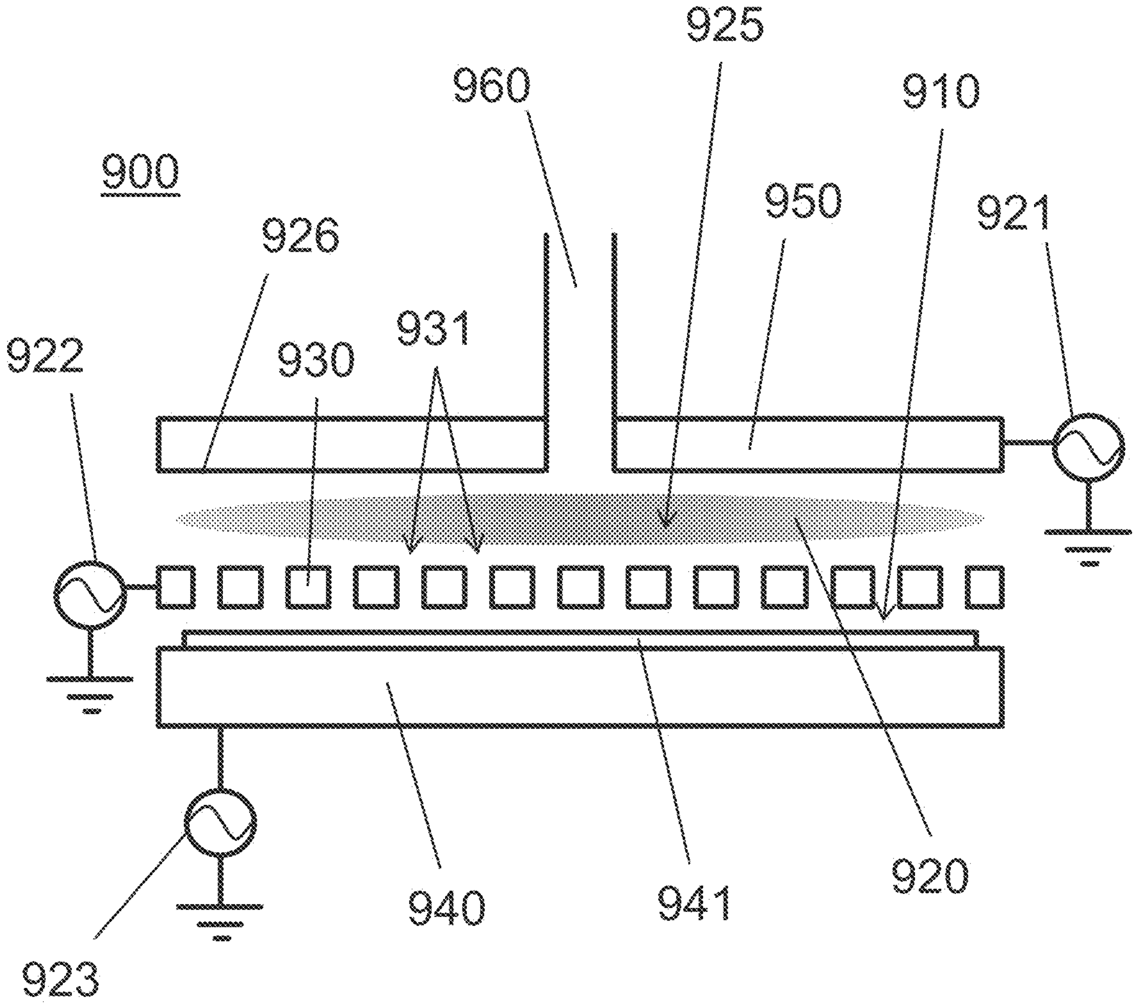
FIG. 9 shows a schematic representation of another embodiment of a sub-system (900) as described herein.

FIG. 9 shows a schematic representation of another embodiment of a sub-system (900) as described herein. It can be used, for example, for forming one or more of a material layer and a gap filling fluid. Additionally or alternatively, it can be employed for etching one or more of a gap filling fluid and a material layer. The configuration of FIG. 9 can be described as an indirect plasma system. The sub-system (900) comprises a reaction chamber (910) which is separated from a plasma generation space (925) in which a plasma (920) is generated. In particular, the reaction chamber (910) is separated from the plasma generation space (925) by a showerhead injector, and the plasma (920) is generated between the showerhead injector (930) and a plasma generation space ceiling (926).

In the configuration shown, the sub-system (900) comprises three alternating current (AC) power sources: a high frequency power source (921) and two low frequency power sources (922, 923): a first low frequency power source (922) and a second low frequency power source (923). In the configuration shown, the high frequency power source (921) supplies radio frequency (RF) power to the plasma generation space ceiling, the first low frequency power source (922) supplies an alternating current signal to the showerhead injector (930), and the second low frequency power source (923) supplies an alternating current signal to the substrate support (940). A substrate (941) is provided on the substrate support (940). The radio frequency power can be provided, for example, at a frequency of 13.56 MHz or higher. The low frequency alternating current signal of the first and second low frequency power sources (922, 923) can be provided, for example, at a frequency of 2 MHz or lower.

Process gas comprising precursor, reactant, or both, is provided through a gas line (960) that passes through the plasma generation space ceiling (926), to the plasma generation space (925). Active species such as ions and radicals generated by the plasma (925) from the process gas pass through holes (931) in the showerhead injector (930) to the reaction chamber (910).

Figure 10:
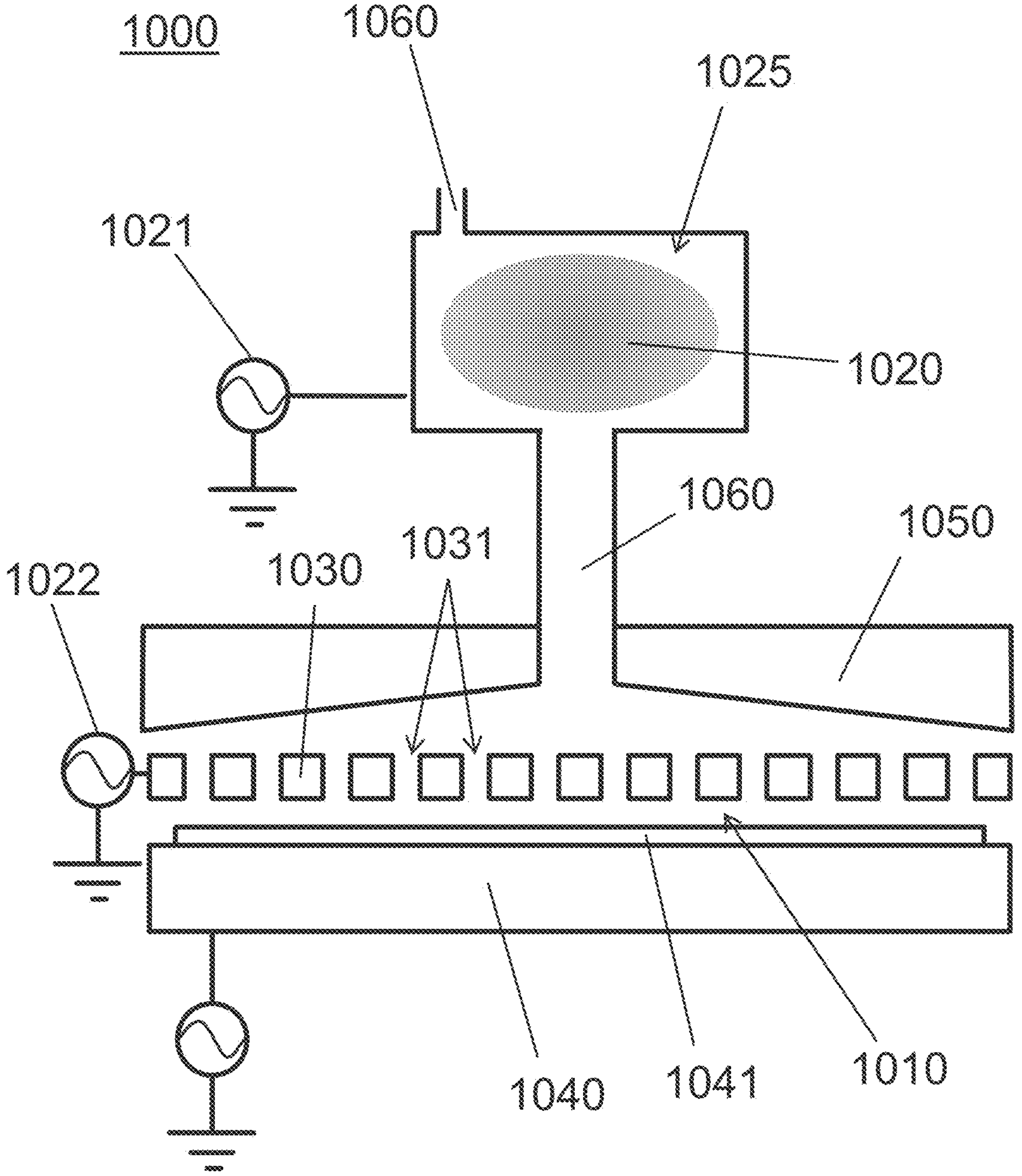
FIG. 10 shows a schematic representation of another embodiment of a sub-system (1000) as described herein.

FIG. 10 shows a schematic representation of another embodiment of a sub-system (1000) as described herein. It can be used, for example, for forming one or more of a material layer and a gap filling fluid. The configuration of FIG. 10 can be described as a remote plasma system. The sub-system (1000) comprises a reaction chamber (1010) which is operationally connected to a remote plasma source (1025) in which a plasma (1020) is generated. Any sort of plasma source can be used as a remote plasma source (1025), for example an inductively coupled plasma, a capacitively coupled plasma, or a microwave plasma.

In particular, active species are provided from the plasma source (1025) to the reaction chamber (1010) via an active species duct (1060), to a conical distributor (1050), through holes (1031) in a shower plate injector (1030), to the reaction chamber (1010). Thus, active species can be provided to the reaction chamber in a uniform way.

In the configuration shown, the sub-system (1000) comprises three alternating current (AC) power sources: a high frequency power source (1021) and two low frequency power sources (1022, 1023): a first low frequency power source (1022) and a second low frequency power source (1023). In the configuration shown, the high frequency power source (1021) supplies radio frequency (RF) power to the plasma generation space ceiling, the first low frequency power source (1022) supplies an alternating current signal to the showerhead injector (1030), and the second low frequency power source (1023) supplies an alternating current signal to the substrate support (1040). A substrate (1041) is provided on the substrate support (1040). The radio frequency power can be provided, for example, at a frequency of 13.56 MHz or higher. The low frequency alternating current signal of the first and second low frequency power sources (1022, 1023) can be provided, for example, at a frequency of 2 MHz or lower.

In some embodiments (not shown), an additional high frequency power source can be electrically connected to the substrate support. Thus, a direct plasma can be generated in the reaction chamber.

Process gas comprising precursor, reactant, or both, is provided to the plasma source (1025) by means of a gas line (1060). Active species such as ions and radicals generated by the plasma (1025) from the process gas are guided to the reaction chamber (1010).

Figure 11:
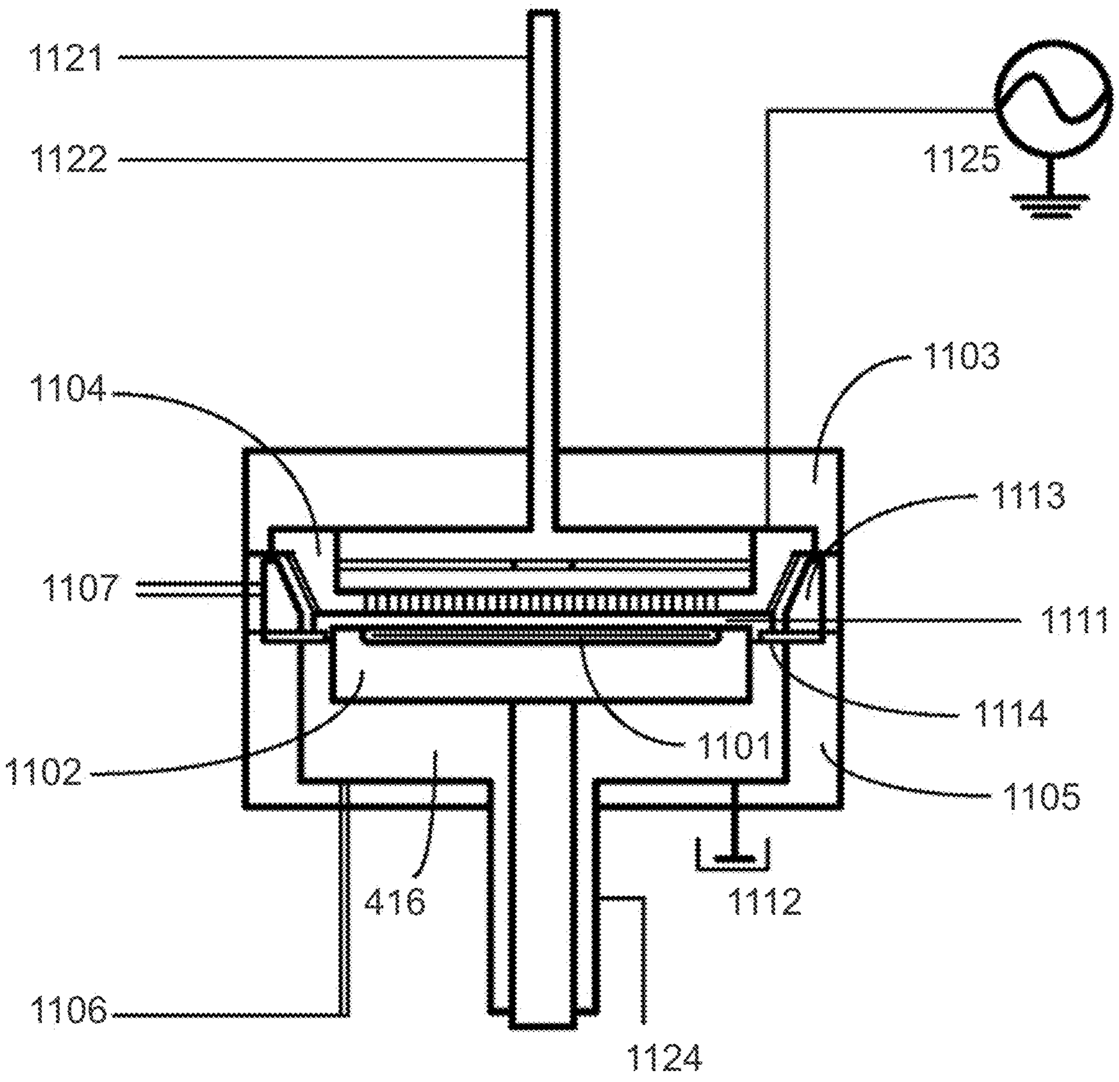
FIG. 11 is a schematic view of a plasma-enhanced atomic layer deposition (PEALD) apparatus, usable in some embodiments of the present disclosure.

The presently provided methods may be executed in any suitable apparatus, including in an embodiment of a semiconductor processing sub-system as shown in FIG. 11. FIG. 11 is a schematic view of a plasma-enhanced atomic layer deposition (PEALD) apparatus, usable in some embodiments of the present disclosure. In this figure, by providing a pair of electrically conductive flat-plate electrodes (1102, 1104) in parallel and facing each other in the interior (1111) (reaction zone) of a reaction chamber (1103), applying RF power (e.g. at 13.56 MHz and/or 27 MHz) from a power source (1125) to one side, and electrically grounding the other side (1112), a plasma can be generated between the electrodes. Of course, there is no need for the semiconductor processing apparatus to generate a plasma during the steps when a precursor is provided to the reaction chamber, or during purges between subsequent processing steps, and no RF power need be applied to any one of the electrodes during those steps or purges. A temperature regulator may be provided in a lower stage (1102), i.e. the lower electrode. A substrate (1101) is placed thereon and its temperature is kept constant at a given temperature. The upper electrode (1104) can serve as a shower plate as well, and various gasses such as a plasma gas, a reactant gas and/or a dilution gas, if any, as well as a precursor gas can be introduced into the reaction chamber (1103) through a gas line (1121) and another gas line (1122), respectively, and through the shower plate (1104). Additionally, in the reaction chamber (1103), a circular duct (1113) with an exhaust line (1117) is provided, through which the gas in the interior (1111) of the reaction chamber (1103) is exhausted. Additionally, a transfer chamber (1105) is disposed below the reaction chamber (1103) and is provided with a gas seal line (1124) to introduce seal gas into the interior (1111) of the reaction chamber (1103) via the interior (416) of the transfer chamber (1105) wherein a separation plate (1114) for separating the reaction zone and the transfer zone is provided.

Note that a gate valve through which a wafer may be transferred into or from the transfer chamber (1105) is omitted from this figure. The transfer chamber is also provided with an exhaust line (1106).

Figure 12A:
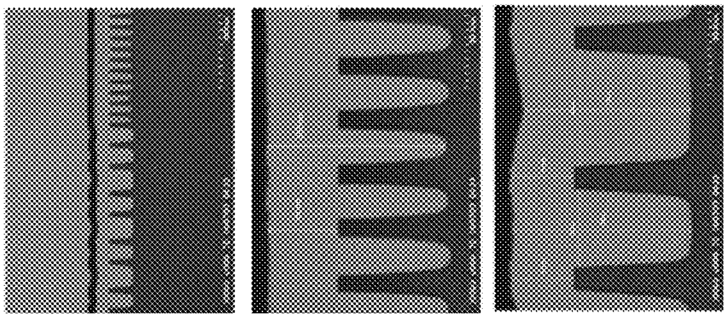
FIGS. 12A-12D show transmission electron micrographs of gaps that are wholly or partially filled with a gap filling fluid that substantially consists of carbon and hydrogen.
Figure 12B:
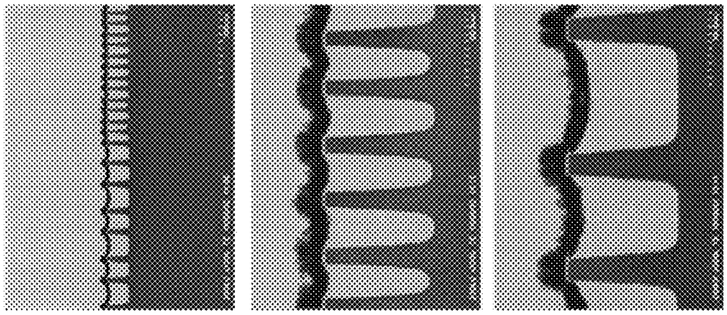
Figure 12C:
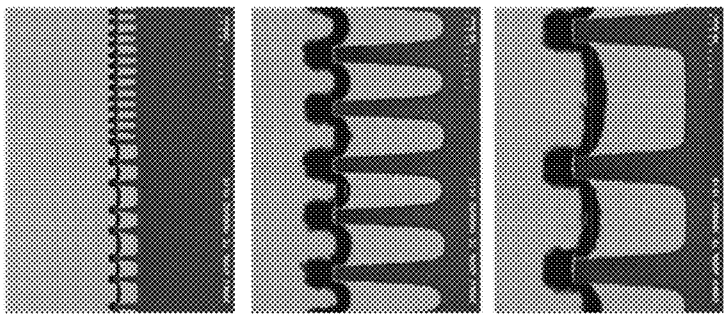
Figure 12D:
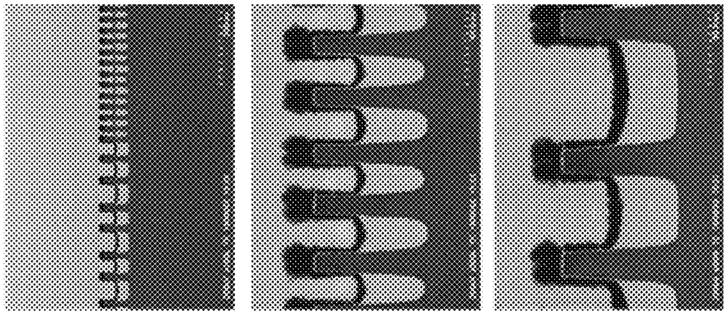

FIGS. 12A-12D show transmission electron micrographs of gaps that are wholly or partially filled with a gap filling fluid that substantially consists of carbon and hydrogen. The gap filling fluid was formed using a plasma-enhanced chemical vapor deposition process using a pulsed plasma, using cyclopentene as a gap fill precursor, and using a pulsed argon plasma, i.e. an argon plasma that is operated in an on-off fashion. FIG. 12A particularly shows images at various zoom levels of the gap filling fluid in an as-deposited state. FIG. 12B shows images at various zoom levels of the gap filling fluid after exposure to an oxygen/argon direct plasma for a short amount of time. FIG. 12C shows images at various zoom levels of the gap filling fluid after exposure to an oxygen/argon direct plasma for a medium amount of time. FIG. 12D shows images at various zoom levels of the gap filling fluid after exposure to an oxygen/argon direct plasma for a longer amount of time. Thus, the amount of gap filling fluid in a gap can be accurately controlled by first completely filling the gaps with gap filling fluid, and then partially etching the gap filling fluid.

Figure 13B:
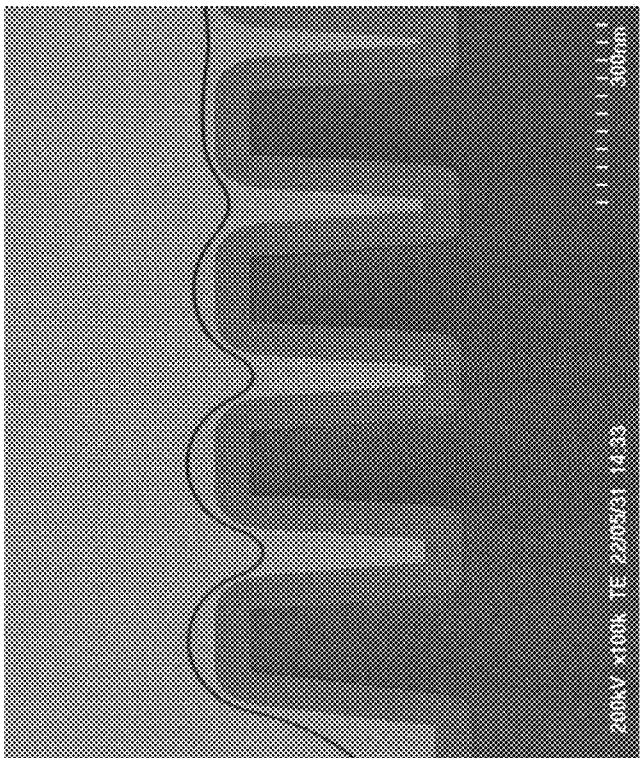
FIGS. 13A and 13B show further transmission electron micrographs of gaps.
Figure 13A:
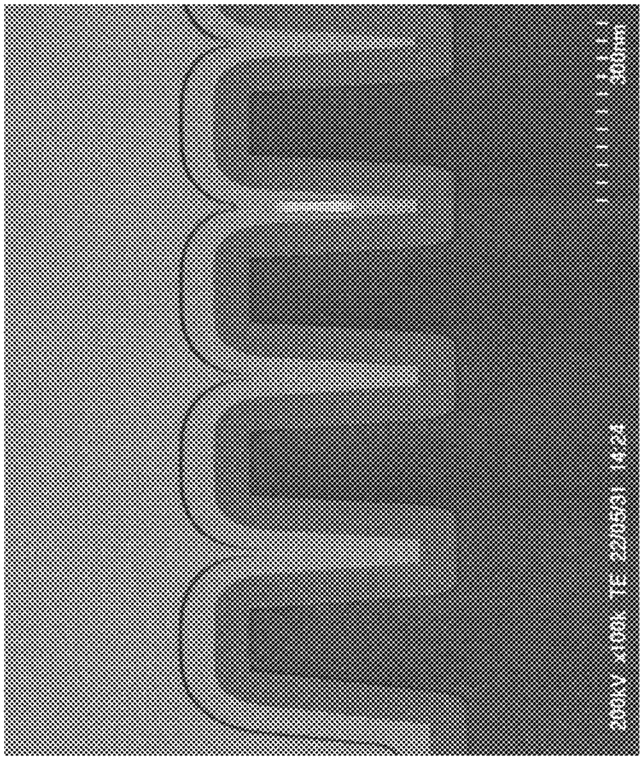

FIGS. 13A and 13B show transmission electron micrographs of gaps. In particular, FIG. 13A shows gaps comprising a reflowable material that was deposited at a temperature of 150° C. The reflowable material comprises voids. FIG. 13B shows gaps comprising the reflowable material after an anneal at a temperature of 250° C. The reflowable material was formed using plasma-enhanced chemical vapor deposition at 150° C. using a He plasma and 2-hydroxy-2-methylpropiophenon as a gap filling precursor. The anneal was carried out for 30 minutes in an Ar atmosphere at 300 Pa.

Figure 14A:
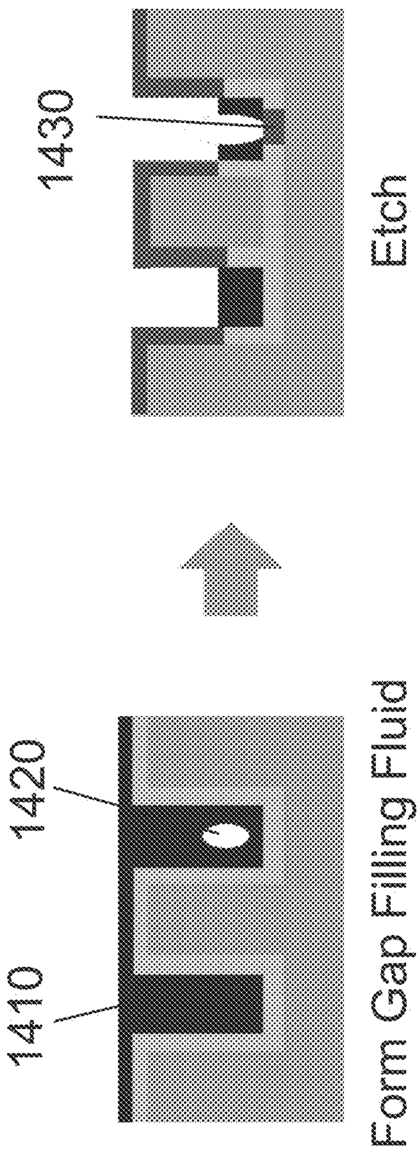
FIGS. 14A and 14B show an exemplary embodiment of a method of filling a gap following a reflow approach.
Figure 14B:
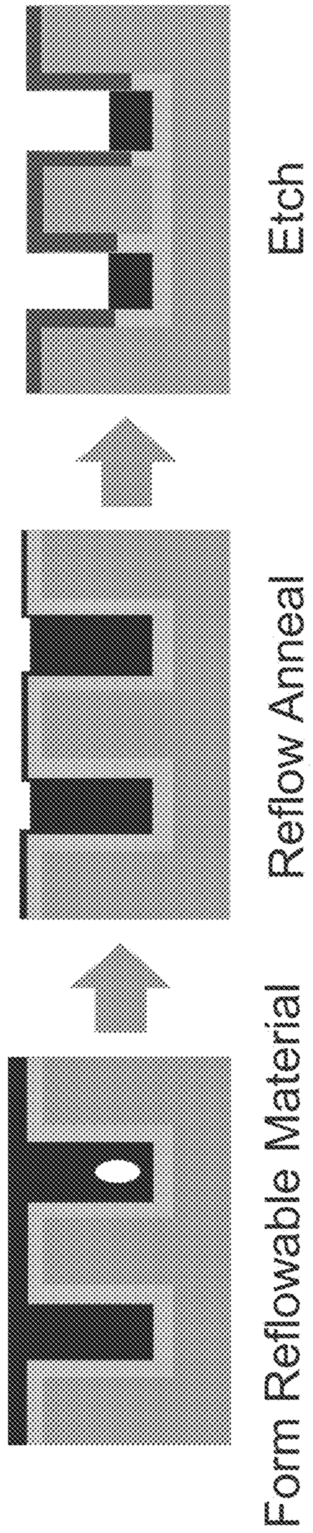

FIGS. 14A and 14B show an exemplary embodiment of a method of filling a gap following a reflow approach. FIGS. 14A and 14B show two process flows. In the process flow shown in FIG. 14A, the gap filling fluid etching step directly follows the gap filling formation step. Such embodiments can suitably fill a gap in case no voids are formed in the gap filling fluid (1410). This notwithstanding, when voids (1420) are formed in the gap filling fluid, they can give rise to formation of defects (1430). In the process flow shown in FIG. 14B, the gap filling fluid etching step is separated from a reflowable material formation step by a reflow anneal. The reflow anneal suitably results in a reflow of the reflowable material and results in a removal of voids therefrom. Thus, during a subsequent etch, no defects are formed.

Figure 15A:
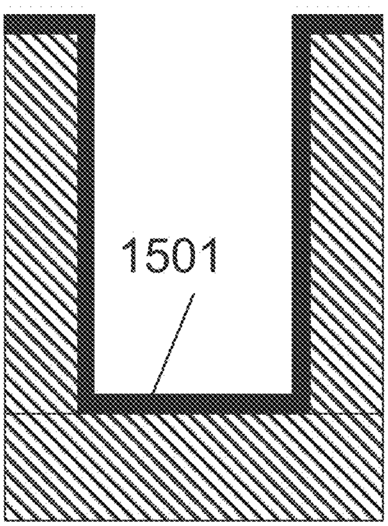
FIGS. 15A-15C show three different embodiments of material layers that can be formed in embodiments of the present disclosure.
Figure 15B:
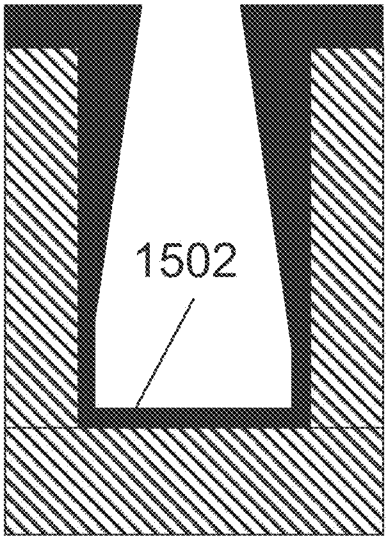
Figure 15C:
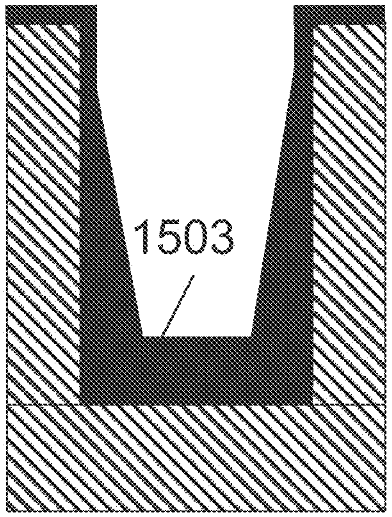

FIGS. 15A-15C show three different embodiments of material layers that can be formed in embodiments of the present disclosure. In particular, FIG. 15A shows an embodiment of a material layer (1501) that is conformal. In other words, this material layer (1501) has the same thickness regardless of where it is formed on the substrate. FIG. 15B shows an embodiment of a material layer that is proximal-heavy. In other words, this material has a greater thickness near or on the substrate's proximal surfaces compared to the sidewalls of the gap and the distal end of the gap. FIG. 15C shows an embodiment of a material layer (1503) that is distal-heavy. In other words, this material layer (1503) has a greater thickness near or at the distal end of the gap compared to the sidewalls of the gap and the substrate's proximal surfaces.

In an exemplary embodiment, reference is made to a particular way of forming a carbon and hydrogen-containing gap filling fluid for use in a method as described herein. Such a gap filling fluid can be formed with any unsaturated organic compound. Suitable precursors particularly include unsaturated cyclic hydrocarbons such as benzene derivatives such as toluene. During formation of such a gap filling fluid, the substrate can be maintained at a temperature of at least 50° C. to at most 150° C., the reaction chamber can be maintained at a pressure of at least 800 Pa to at most 3000 Pa. A capacitively coupled direct plasma can be employed using a plasma power of at least 50 W to at most 300 W for a 300 mm circular substrate. It shall be understood that the process can be readily transferred to other substrate sizes by scaling plasma power with substrate area. A noble gas such as He or Ar can be employed as a plasma gas, and can be provided to the reaction chamber at a flow rate of at least 0.5 to at most 12 standard liters per minute (slm). The gap fill precursor can be suitably be kept in a vessel that is maintained at a temperature which is lower than the temperature of the substrate. For example, the gap fill precursor can be maintained at a temperature of at least 25 to at most 100° C.

In a further exemplary embodiment, reference is made to a method for forming a gap filling fluid for use in a method as described herein. In particular, the method first comprises forming a reflowable material in the gap. The reflowable material can comprise carbon and oxygen, and can be formed by capacitively generating a direct noble gas plasma. A reflowable material precursor comprising 2-hydroxy-2-methylpropiophenone can be added to the plasma for reflowable material formation. During reflowable material formation, the substrate can be maintained at a temperature of at least 100° C. to at most 250° C., for example at 150° C. Then, the substrate can be annealed in a noble gas such as Ar at a higher temperature than the deposition temperature, for example at a temperature of 430° C. During the anneal, the substrate can be present in an atmosphere at a pre-determined pressure, such as a pressure of 300 Pa. Suitable annealing times can vary, e.g. from at least 1 minute to at most 2 hours. For example, the annealing time can be 30 minutes.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method comprising, providing a substrate, the substrate comprising a proximal surface and a gap, the gap comprising a distal surface and sidewalls; and executing a plurality of super cycles that wholly fill the gap with a solid material, each super cycle of the plurality of super cycles comprising:

forming a material layer overlying the proximal surface, the distal surface, and the sidewalls, wherein the material layer comprises the solid material comprising silicon nitride;

partially filling the gap with a gap filling fluid, thereby forming a protected distal material layer and an unprotected proximal material layer, the protected distal material layer overlying the distal surface, the distal surface being covered by the gap filling fluid, and the unprotected proximal material layer overlying the sidewalls and the proximal surface;

converting the unprotected proximal material layer into a converted material layer comprising silicon oxide, wherein the converting comprises generating an oxygen plasma;

selectively etching the converted material layer vis-à-vis the gap filling fluid, wherein the selectively etching comprises exposing the substrate to a fluorine species; and removing the gap filling fluid from the substrate, thereby forming a distal layer on the distal surface.

2. The method according to claim 1, wherein the following steps are carried out in a single vacuum system without any intervening vacuum breaks: forming the material layer, partially filling the gap with the gap filling fluid, selectively etching the converted material layer, and removing the gap filling fluid.

3. A method comprising, providing a substrate, the substrate comprising a proximal surface and a gap, the gap comprising a distal surface and sidewalls; and executing a plurality of super cycles that wholly fill the gap with a solid fill material, each super cycle of the plurality of super cycles comprising:

forming a material layer overlying the proximal surface, the distal surface, and the sidewalls, the material layer comprising the solid fill material;

partially filling the gap with a gap filling fluid, thereby partially covering the material layer with the gap filling fluid to form a protected distal material layer and an unprotected proximal material layer, the protected distal material layer overlying the distal surface, the distal surface being covered by the gap filling fluid, and the unprotected proximal material layer overlying the sidewalls and the proximal surface;

selectively etching the unprotected proximal material layer vis-à-vis the gap filling fluid; and removing the gap filling fluid from the substrate.

4. The method according to claim 3, wherein the plurality of super cycles are sequentially carried out in a single vacuum system, without any intervening vacuum breaks.

5. The method according to claim 3, wherein the solid fill material comprising one or more elements selected from a transition metal, a rare earth metal, a post transition metal, and a group 14 element.

6. The method according to claim 5, wherein the solid fill material comprises one or more of titanium oxide and titanium nitride.

7. The method according to claim 5, wherein the solid fill material comprises a group 14 element nitride.

8. The method according to claim 7, wherein the solid fill material comprises one or more of silicon oxide, silicon nitride, and silicon carbonitride.

9. The method according to claim 5, wherein selectively etching the unprotected proximal material layer comprises a. converting the unprotected proximal material layer into a converted material layer; and b. selectively etching the converted material layer vis-à-vis the gap filling fluid.

10. The method according to claim 9, wherein the solid fill material comprises silicon nitride, wherein the converting comprises generating an oxygen plasma, wherein the converted material layer comprises silicon oxide, and wherein the selectively etching comprises exposing the substrate to a fluorine species.

11. The method according to claim 10, wherein the fluorine species comprises fluorine radicals.

12. The method according to claim 3, wherein forming the material layer comprises executing a cyclical deposition process, the cyclical deposition process comprising a plurality of deposition cycles, a deposition cycle of the plurality of deposition cycles comprising a material layer precursor pulse and a material layer reactant pulse, wherein the material layer precursor pulse comprises contacting the substrate with a material layer precursor, and wherein the material layer reactant pulse comprises contacting the substrate with a material layer reactant.

13. The method according to claim 3, wherein partially filling the gap with the gap filling fluid comprises generating a plasma.

14. The method according to claim 13, wherein partially filling the gap with the gap filling fluid comprises positioning the substrate on a substrate support comprised in the gap filling fluid reaction space, the gap filling fluid reaction space further comprising a showerhead injector;

wherein the plasma is generated between the substrate and the showerhead injector; and, wherein partially filling the gap with the gap filling fluid further comprises providing the gap filling fluid precursor to the reaction space.

15. The method according to claim 14, wherein the gap filling fluid precursor comprises a hydrocarbon.

16. The method according to claim 15, wherein the hydrocarbon is an aromatic hydrocarbon.

17. The method according to claim 16, wherein the aromatic hydrocarbon is toluene.

18. The method according to claim 3, wherein removing the gap filling fluid from the substrate comprises generating an oxygen plasma.

19. The method according to claim 3, wherein removing the gap filling fluid from the substrate comprises exposing the substrate to a solvent.

20. The method according to claim 3, wherein partially filling the gap with the gap filling fluid comprises:

forming a reflowable material in the gap; and annealing the substrate to a temperature in excess of a pre-determined temperature, thereby at least partially melting the reflowable material to form the gap filling fluid that at least partially fills the gap.

* * * * *